US012367941B2

(12) United States Patent
Guo

(10) Patent No.: US 12,367,941 B2
(45) Date of Patent: *Jul. 22, 2025

(54) NON-DESTRUCTIVE MODE CACHE PROGRAMMING IN NAND FLASH MEMORY DEVICES

(71) Applicant: YANGTZE MEMORY TECHNOLOGIES CO., LTD., Wuhan (CN)

(72) Inventor: Jason Guo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/538,843

(22) Filed: Dec. 13, 2023

(65) Prior Publication Data
US 2024/0127899 A1 Apr. 18, 2024

Related U.S. Application Data

(63) Continuation of application No. 17/531,217, filed on Nov. 19, 2021, now Pat. No. 11,894,075, which is a (Continued)

(51) Int. Cl.
G11C 7/00 (2006.01)
G11C 7/10 (2006.01)
(Continued)

(52) U.S. Cl.
CPC ........ *G11C 16/3459* (2013.01); *G11C 7/1039* (2013.01); *G11C 16/102* (2013.01);
(Continued)

(58) Field of Classification Search
CPC .................................................. G11C 7/106
(Continued)

(56) References Cited

U.S. PATENT DOCUMENTS 7,298,648 B2  11/2007 Lee et al.
7,313,024 B2  12/2007 Lee
(Continued)

FOREIGN PATENT DOCUMENTS

CN    1835123 A    9/2006
CN  102385918 A    3/2012
(Continued)

OTHER PUBLICATIONS

International Search Report issued in corresponding International Application No. PCT/CN2020/111690, mailed May 27, 2021, 4 pages.

*Primary Examiner* — Hoai V Ho
(74) *Attorney, Agent, or Firm* — BAYES PLLC

(57) ABSTRACT

A memory device includes memory cells arranged in rows and columns, each memory cell configured to store n-bit of data, where n is a whole number larger than two, and a periphery circuit coupled to the memory cells and configured to program selected memory cells according to n logic pages of current programming data. The periphery circuit includes page buffers, and each page buffer includes latches. The periphery circuit is configured to store the n logic pages of the current programming data in the latches for programming the selected memory cells, release one or more of the latches, by discarding one or more of the n logic pages of the current programming data correspondingly, before the programming the selected memory cells according to the n logic pages of the current programming data is completed, and store one of n logic pages of next programming data in one or more of the latches before the programming the selected memory cells according to the n logic pages of the current programming data is completed.

20 Claims, 24 Drawing Sheets

Related U.S. Application Data continuation of application No. 17/062,228, filed on Oct. 2, 2020, now Pat. No. 11,189,326, which is a continuation of application No. PCT/CN2020/111690, filed on Aug. 27, 2020.

(51) Int. Cl.

| | | |
|---|---|---|
| *G11C 16/10* | (2006.01) | |
| *G11C 16/24* | (2006.01) | |
| *G11C 16/26* | (2006.01) | |
| *G11C 16/34* | (2006.01) | |

(52) U.S. Cl.
CPC .............. *G11C 16/24* (2013.01); *G11C 16/26* (2013.01); *G11C 16/3404* (2013.01)

(58) Field of Classification Search
USPC .......................................... 365/189.05, 238.5
See application file for complete search history.

(56) References Cited

U.S. PATENT DOCUMENTS

| | | |
|---|---|---|
| 8,467,246 B2 | 6/2013 | Kim et al. |
| 9,484,097 B2 | 11/2016 | Kim |
| 11,189,326 B1 | 11/2021 | Guo |
| 11,894,075 B2 * | 2/2024 | Guo ..................... G11C 16/102 |
| 2005/0213378 A1 | 9/2005 | Chang |
| 2016/0005490 A1 | 1/2016 | Shim |
| 2016/0055919 A1 | 2/2016 | Park et al. |
| 2017/0076789 A1 | 3/2017 | Oh et al. |
| 2019/0317691 A1 | 10/2019 | Kanno |
| 2020/0258577 A1 | 8/2020 | Lee et al. |
| 2021/0090638 A1 | 3/2021 | Hung et al. |

FOREIGN PATENT DOCUMENTS

| | | |
|---|---|---|
| CN | 109273039 A | 1/2019 |
| CN | 112204536 A | 1/2021 |
| EP | 2487687 A1 | 8/2012 |
| TW | 301619 B | 10/2008 |
| TW | 308756 B | 4/2009 |
| TW | 201225088 A | 6/2012 |

* cited by examiner

|  | ER | P1 | P2 | P3 | P4 | P5 | P6 | P7 |
|---|---|---|---|---|---|---|---|---|
| lower page | 1 | 0 | 0 | 0 | 0 | 1 | 1 | 1 |
| middle page | 1 | 1 | 0 | 0 | 1 | 1 | 0 | 0 |
| upper page | 1 | 1 | 1 | 0 | 0 | 0 | 0 | 1 |

FIG. 4A

|  | ER | P1 | P2 | P3 | P4 | P5 | P6 | P7 |
|---|---|---|---|---|---|---|---|---|
| latch D1 | 1 | 0 | 1 | 0 | 0 | 1 | 1 | 0 |
| latch D2 | 1 | 0 | 0 | 1 | 0 | 1 | 0 | 1 |
| latch D3 | 1 | 0 | 0 | 0 | 1 | 0 | 1 | 1 |

| | | |
|---|---|---|
| lower page | | |
| middle page | | |
| upper page | | |

FIG. 4B

| | ER | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| lower page | 1 | 1 | 0 | 0 | 0 | 0 | 0 | 0 | 1 | 1 | 1 | 1 | 1 | 1 | 0 | 0 |
| middle page | 1 | 1 | 1 | 0 | 0 | 0 | 0 | 1 | 1 | 0 | 0 | 0 | 0 | 1 | 1 | 1 |
| upper page | 1 | 1 | 1 | 1 | 1 | 0 | 0 | 0 | 0 | 1 | 1 | 1 | 0 | 0 | 0 | 1 |
| top page | 1 | 0 | 0 | 0 | 1 | 1 | 0 | 0 | 0 | 0 | 0 | 1 | 1 | 1 | 1 | 1 |

FIG. 4C

| | | ER | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|---|
| lower page | Latch D1 | 1 | 0 | 0 | 0 | 0 | 1 | 1 | 1 | 0 | 0 | 0 | 0 | 1 | 1 | 0 | 1 |
| middle page | Latch D2 | 1 | 0 | 0 | 1 | 1 | 1 | 1 | 0 | 0 | 1 | 1 | 0 | 0 | 0 | 1 | 0 |
| upper page | Latch D3 | 1 | 0 | 0 | 0 | 0 | 0 | 1 | 1 | 1 | 1 | 0 | 1 | 0 | 1 | 1 | 1 |
| top page | Latch D4 | 1 | 0 | 1 | 0 | 0 | 0 | 0 | 0 | 0 | 1 | 1 | 1 | 1 | 1 | 1 | 1 |

FIG. 4D

| Latches in the Page Buffer | Data Stored in the Latches |
|---|---|
| Latch D1 | Lower page |
| Latch D2 | Middle page |
| Latch D3 | Upper page |
| Latch SL | 3 bit line information |
| Latch SA | Sensing latch |
| Cache Latch CA | Inhibit information |

FIG. 6A

| Latches in the Page Buffer | Data Stored in the Latches |
|---|---|
| Latch D1 | Lower page |
| Latch D2 | Middle page |
| Latch D3 | Upper page |
| Latch D4 | Top page |
| Latch SL | 3 bit line information |
| Latch SA | Sensing latch |
| Cache Latch CA | Inhibit information |

FIG. 6B

| Latches in the Page Buffer | Data Stored in the Latches |
|---|---|
| Latch D1 | Lower page |
| Latch D2 | Middle page |
| Latch D3 | Inhibit information |
| Latch SL | 3 bit line information |
| Latch SA | Sensing latch |
| Cache Latch CA | New lower page |

FIG. 9

| Latches in the Page Buffer | Data Stored in the Latches |
|---|---|
| Latch D1 | New lower page |
| Latch D2 | Middle page |
| Latch D3 | Inhibit information |
| Latch SL | 3 bit line information |
| Latch SA | Sensing latch |
| Cache Latch CA | New middle page |

FIG. 13

| Latches in the Page Buffer | Data Stored in the Latches |
|---|---|
| Latch D1 | New lower page |
| Latch D2 | Middle page |
| Latch D3 | Inhibit information |
| Latch SL | New middle page |
| Latch SA | Sensing latch |
| Cache Latch CA | New upper page |

FIG. 15

|  | ER | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| lower page | Latch D1 | 1 | 0 | 0 | 0 | 1 | 0 | 1 | 1 | 0 | 1 | 0 | 0 | 1 | 0 | 1 | 1 |
| middle page | Latch D2 | 1 | 0 | 0 | 1 | 0 | 1 | 1 | 0 | 0 | 1 | 0 | 1 | 0 | 1 | 0 | 1 |
| upper page | Latch D3 | 1 | 0 | 1 | 0 | 0 | 1 | 0 | 1 | 0 | 1 | 1 | 0 | 0 | 1 | 1 | 0 |
| top page | Latch D4 | x | x | x | x | x | x | x | x | x | x | x | x | x | x | x | x |
| SLC read from $V_{R8}$ |  | 1 | 1 | 1 | 0 | 1 | 1 | 1 | 1 | 0 | 0 | 0 | 0 | 0 | 0 | 0 | 0 |
| recovered top page |  | 1 | 0 | 0 | 0 | 0 | 0 | 0 | 0 | 1 | 1 | 1 | 1 | 1 | 1 | 1 | 1 |

FIG. 18

NON-DESTRUCTIVE MODE CACHE PROGRAMMING IN NAND FLASH MEMORY DEVICES

CROSS-REFERENCE TO RELATED APPLICATIONS

This application is a continuation of U.S. application Ser. No. 17/531,217, filed on Nov. 19, 2021, entitled "Non-Destructive Mode Cache Programming in NAND Flash Memory devices," issued as U.S. Pat. No. 11,894,075, which is a continuation-in-part of U.S. application Ser. No. 17/062,228, filed on Oct. 2, 2020 and titled "Non-Destructive Mode Cache Programming in NAND Flash Memory devices," issued as U.S. Pat. No. 11,189,326, which is a continuation of International Application No. PCT/CN2020/111690, filed on Aug. 27, 2020, all of which are incorporated herein by reference in their entireties.

TECHNICAL FIELD

The present disclosure generally relates to the field of semiconductor technology, and more particularly, to cache programming in a NAND flash memory.

BACKGROUND

In many servers and mobile devices, NAND flash memory is widely used as the primary non-volatile storage device due to its high storage density and relatively low access latency. To reduce cost and improve programming speed, programming data are usually not stored in the host computer after sent to the NAND flash memory. To prevent data loss in event of programming failure, a NAND flash memory typically stores the original programming data in the page buffers throughout the entire programming operation, where the original programming data can be recovered in case of programming failure.

To increase storage capacity, in a state-of-art NAND flash memory, each memory cell can store multiple bits. Programming and verifying each memory cell is therefore prolonged. Currently, new programming data are sent to the page buffer after the previous programming operation is completed and the programming data stored in the memory cells are verified. In a high speed storage system, the data-in time in the page buffer can limit the overall system write performance. Therefore, it is necessary to optimize cache programming.

BRIEF SUMMARY

Embodiments of methods for cache programming in a NAND flash memory device are described in the present disclosure.

One aspect of the present disclosure provides a method of cache programming of a NAND flash memory. The method includes discarding a first logic page of first programming data from a first set of data latches in a plurality of page buffers of the NAND flash memory when a first group of logic states are programmed and verified for a plurality of memory cells in a memory page of the NAND flash memory. Each of the plurality of memory cells comprises $2^n$ logic states. Each of the plurality of memory cells is coupled to at least one of the plurality of page buffers. The plurality of page buffers comprises n set of data latches configured to store n logic pages of programming data. The method also includes uploading a second logic page of second programming data to a set of cache latches in the plurality of page buffers.

In some embodiments, the method also includes transferring inhibit information from the set of cache latches to the first set of data latches after the discarding the first logic page. The method further includes inhibiting the plurality of memory cells from further programming when the inhibit information comprises logic "1."

In some embodiments, the method also includes, prior to discarding the first logic page, programming the first group of logic states for the plurality of memory cells, wherein the first group of logic states comprise a first group of threshold voltages lower than a second group of threshold voltages of a second group of logic states of the plurality of memory cells. The method further includes programming the plurality of memory cells to the second group of logic states according to remaining logic pages of the first programming data.

In some embodiments, the method also includes verifying each of the $2^n$ logic states of the plurality of memory cells by using a plurality of read reference voltages, each read reference voltage comprising a magnitude between threshold voltages of two adjacent logic states.

In some embodiments, the method also includes programming the plurality of memory cells from a first logic state with a lowest threshold voltage to an nth logic state with a highest threshold voltage.

In some embodiments, the method also includes recovering the first logic page of the first programming data when a programming failure occurs. The method further includes reading the plurality of memory cells by using a first read reference voltage, wherein the first read reference voltage separates the $2^n$ logic states into two distinguishable groups. The method also includes constructing binary codes for the first logic page based on remaining logic pages and the two distinguishable groups.

Another aspect of the present disclosure provides a method of cache programming of a NAND flash memory in a triple-level-cell (TLC) mode. The method includes discarding an upper page of a first programming data from a first set of data latches in a plurality of page buffers of the NAND flash memory when a first group of logic states are programmed and verified for a plurality of memory cells in a memory page of the NAND flash memory. Each of the plurality of memory cells has 8 logic states. The 8 logic states can be an erased state and ith logic states, wherein i=1 to 7 and threshold voltages of the 8 logic states are in an ascending order. Each of the plurality of memory cells is coupled to at least one of the plurality of page buffers. The plurality of page buffers comprises the first set of data latches, a second set of data latches and a third set of data latches, configured to store the upper page, a middle page and a lower page of programming data, respectively. The method further includes uploading a lower page of second programming data to a set of cache latches in the plurality of page buffers.

In some embodiments, the method also includes transferring inhibit information from the set of cache latches to the first set of data latches after the discarding the upper page, and inhibiting the plurality of memory cells from further programming when the inhibit information comprises logic "1."

In some embodiments, the method also includes, prior to discarding the upper page, programming the first group of logic states for the plurality of memory cells, wherein the first group of logic states comprises the first, second, third and fourth logic states. The method further includes programming the plurality of memory cells to the fifth, sixth and seventh logic states according to the middle page and the lower page of the first programming data.

In some embodiments, the method also includes recovering the upper page of the first programming data when a programming failure occurs. The method further includes reading the plurality of memory cells by using a first read reference voltage, wherein the first read reference voltage separates the 8 logic states into two distinguishable groups. The method also includes constructing binary codes for the upper page based on the middle page, the lower page and the two distinguishable groups.

In some embodiments, the method also includes discarding the lower page of the first programming data from the third set of data latches in the plurality of page buffers when a third group of logic states are programmed and verified for the plurality of memory cells. The method further includes transferring the lower page of the second programming data from the set of cache latches to the third set of data latches after the discarding the lower page of the first programming data, and uploading a middle page of the second programming data to the set of cache latches. The method also includes discarding 3-bit-line information from a set of control latches in the plurality of page buffers when the sixth logic state is programmed and verified for the plurality of memory cells, and uploading an upper page of the second programming data to the set of control latches.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 4A-4D illustrate mapping schemes of logic pages and the states of a NAND flash memory, according to some embodiments of the present disclosure.

FIGS. 6A-6B illustrate exemplary cache usages of a page buffer, according to some embodiments of the present disclosure.

FIG. 9 illustrates an exemplary cache usage of a page buffer, according to some embodiments of the present disclosure.

FIG. 13 illustrates an exemplary cache usage of a page buffer, according to some embodiments of the present disclosure.

FIG. 15 illustrates an exemplary cache usage of the page buffer, according to some embodiments of the present disclosure.

FIGS. 18-20 illustrate mapping and recovery schemes of logic pages, according to some embodiments of the present disclosure.

Figure 1A:
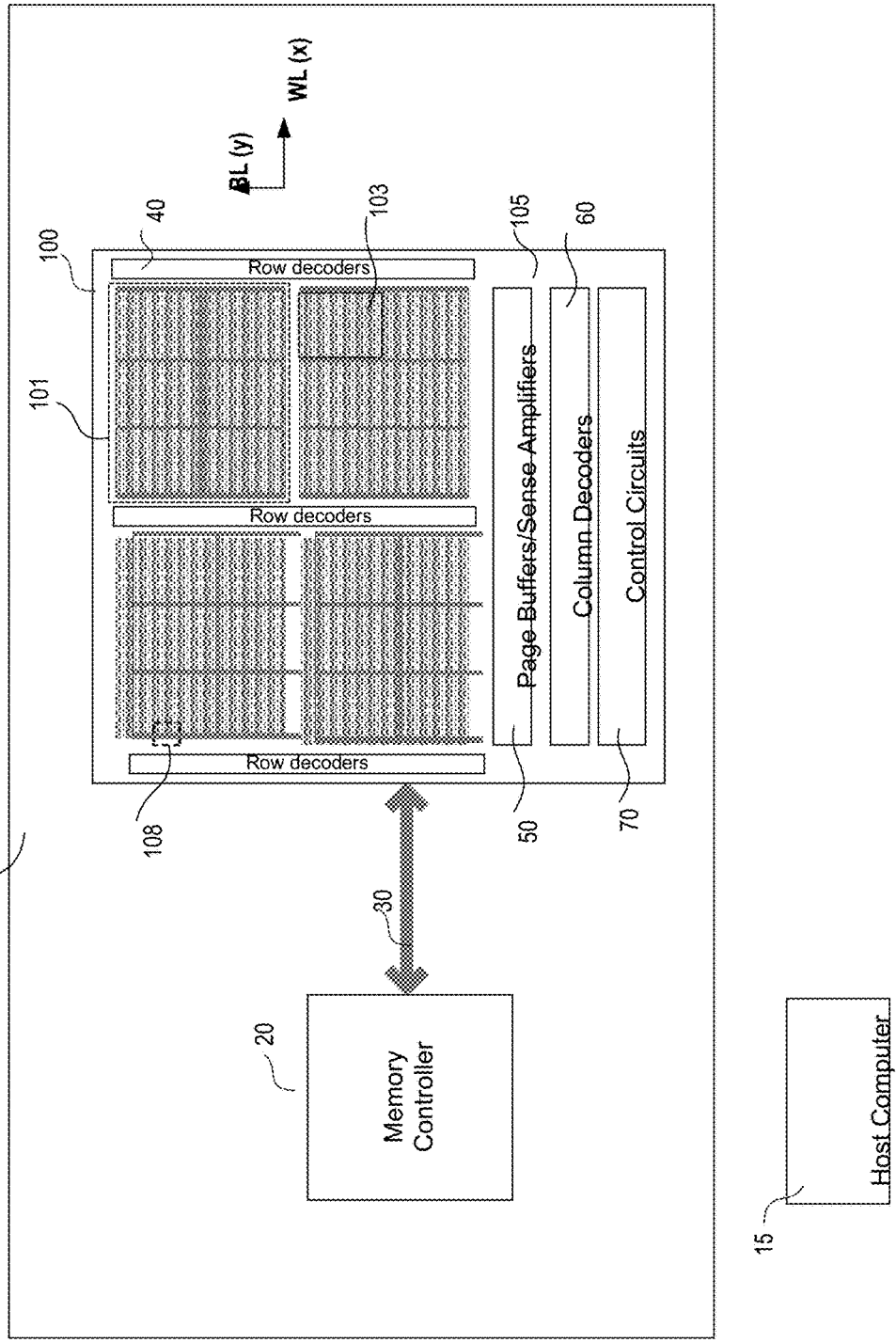
FIGS. 1A-1C illustrates a storage system with a NAND flash memory, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

FIG. 1A illustrates a block diagram of an exemplary system Si having a storage system 10, according to some embodiments of the present disclosure. System Si can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The storage system 10 (also referred to as a NAND storage system) includes a NAND flash memory 100 and a host controller 20 (also referred to as a memory controller). The storage system 10 can communicate with a host computer 15 through the memory controller 20, where the memory controller 20 can be connected to the NAND flash memory 100 via a memory channel 30. In some embodiments, the storage system 10 can have more than one NAND flash memory 100, while each NAND flash memory 100 can be managed by the memory controller 20.

In some embodiments, the host computer 15 can include a processor of an electronic device, such as a central processing unit (CPU), or a system-on-chip (SoC), such as an application processor (AP). The host computer 15 sends data to be stored at the NAND storage system or storage system 10 or retrieves data by reading the storage system 10.

The memory controller 20 can handle I/O requests received from the host computer 15, ensure data integrity and efficient storage, and manage the NAND flash memory 100. The memory channel 30 can provide data and control communication between the memory controller 20 and the NAND flash memory 100 via a data bus.

Figure 1B:
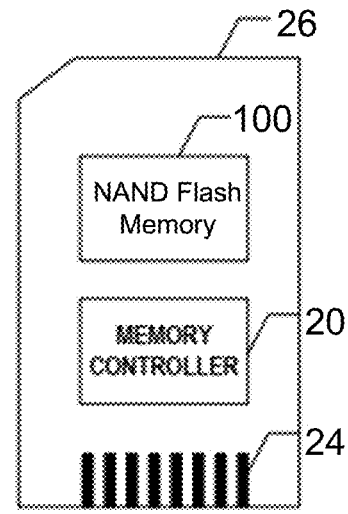
Figure 1C:
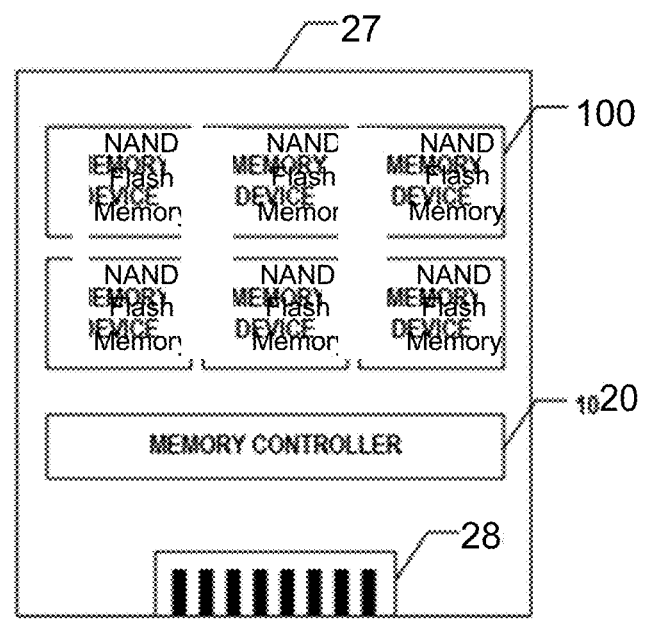

Memory controller 20 and one or more NAND flash memory 100 can be integrated into various types of storage devices, for example, be included in the same package, such as a universal Flash storage (UFS) package or an eMMC package. That is, storage system 10 can be implemented and packaged into different types of end electronic products. In one example as shown in FIG. 1B, memory controller 20 and a single NAND flash memory 100 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host computer 15 in FIG. 16). In another example as shown in FIG. 1C, memory controller 20 and multiple NAND flash memories 100 can be integrated into a solid-state drive (SSD) 27. SSD 27 can further include an SSD connector 28 coupling SSD 27 with a host (e.g., the host computer 15 in FIG. 1A).

Referring to FIG. 1A, the NAND flash memory 100 (i.e., "flash," "NAND flash" or "NAND") can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1A, the exemplary NAND flash memory 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" respectively in FIG. 1A. In this disclosure, the memory block 103 is also referred to as the "memory array" or "array." The memory array is the core area in a memory device, performing storage functions.

The NAND flash memory 100 also includes a periphery region 105, an area surrounding memory planes 101. The periphery region 105, also named as periphery circuits, contains many digital, analog, and/or mixed-signal circuits to support functions of the memory array, for example, page buffers/sense amplifiers 50, row decoders 40, column decoders 60, and control circuits 70. Control circuits 70 include register, active and/or passive semiconductor devices, such as transistors, diodes, capacitors, resistors, etc., as would be apparent to a person of ordinary skill in the art. The control circuits 70 of the peripheral region 105 can be configured to initiate a program operation on a select memory cell of a NAND memory string in the memory block 103. In some implementations, the control circuits 70 receives a program command from a memory controller (e.g., memory controller 20) through interface, and in response, sends control signals to at least row decoder/word line driver, column decoder/bit line driver, and voltage generator deposed in the peripheral region 105 to initiate the program operation on the select memory cell.

It is noted that the layout of the electronic components in the storage system 10 and the NAND flash memory 100 in FIG. 1A are shown as an example. The storage system 10 and the NAND flash memory 100 can have other layouts and can include additional components. For example, The NAND flash memory 100 can also have high-voltage charge pumps, I/O circuits, etc. The storage system 10 can also include firmware, data scrambler, etc.

Figure 2A:
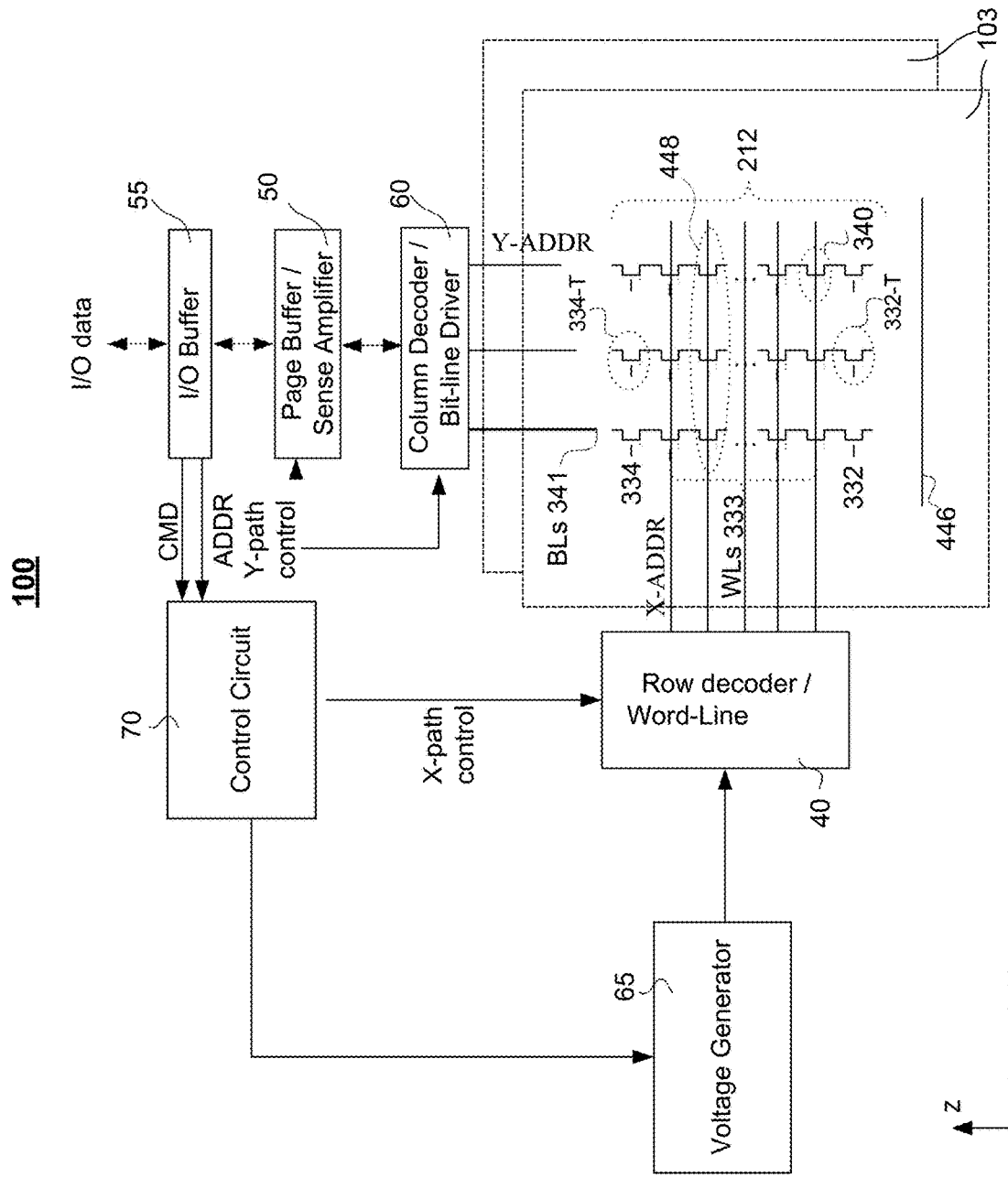
FIG. 2A shows a schematic circuit diagram of a NAND flash memory, according to some embodiments of the present disclosure.

FIG. 2A shows a schematic diagram of the NAND flash memory 100, according to some embodiments of the present disclosure. The NAND flash memory 100 includes one or more memory blocks 103. Each memory block 103 includes memory strings 212. Each memory string 212 includes memory cells 340. The memory cells 340 sharing the same word line form a memory page 448. The memory string 212 can also include at least one field effect transistor (e.g., MOSFET) at each end, which is controlled by a bottom select gate (BSG) 332 and a top select gate (TSG) 334, respectively. The drain terminal of a top select transistor 334-T can be connected to the bit line 341, and the source terminal of a bottom select transistor 332-T can be connected to an array common source (ACS) 446. The ACS 446 can be shared by the memory strings 212 in an entire memory block, and is also referred to as the common source line.

The NAND flash memory 100 can also include a periphery circuit that includes many digital, analog, and/or mixed-signal circuits to support functions of the memory block 103, for example, a page buffer/sense amplifier 50, a row decoder/word line driver 40, a column decoder/bit line driver 60, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

The memory blocks 103 can be coupled with the row decoder/word line driver 40 via word lines ("WLs") 333, bottom select gates ("BSGs") 332 and top select gates ("TSG") 334. The memory blocks 103 can be coupled with the page buffer/sense amplifier 50 via bit lines ("BLs") 341. The row decoder/word line driver 40 can select one of the memory blocks 103 on the NAND flash memory 100 in response to an X-path control signal provided by the control circuit 70. The row decoder/word line driver 40 can transfer voltages provided from the voltage generator 65 to the word lines according to the X-path control signal. During the read and programming operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70.

The column decoder/bit line driver 60 can transfer an inhibit voltage $V_{inhibit}$ to an unselected bit line and connect a selected bit line to ground according to a Y-path control signal received from the control circuit 70. In other words, the column decoder/bit line driver 60 can be configured to select or unselect one or more memory strings 212 according to the Y-path control signal from the control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed into one memory page 448. In another example, page buffer/sense amplifier 50 can perform verify operations to ensure that the data has been properly programmed into each memory cell 340. In yet another example, during a read operation, the page buffer/sense amplifier 50 can sense current flowing through the bit line 341 that reflects the logic state (i.e., data) of the memory cell 340 and amplify small signal to a measurable magnification.

The input/output buffer 55 can transfer the I/O data from/to the page buffer/sense amplifier 50 as well as addresses ADDR or commands CMD to the control circuit 70. In some embodiments, the input/output buffer 55 can function as an interface between the memory controller 20 (in FIG. 1A) and the NAND flash memory 100.

The control circuit 70 can control the page buffer/sense amplifier 50 and the row decoder/word line driver 40 in response to the commands CMD transferred by the input/output buffer 55. During the programming operation, the control circuit 70 can control the row decoder/word line driver 40 and the page buffer/sense amplifier 50 to program a selected memory cell. During the read operation, the control circuit 70 can control the row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify the memory page 448, memory block 103, and memory plane 101 (in FIG. 1A), respectively. The column address Y-ADDR can identify a byte or a word in the data of the memory page 448.

In some implementations, the control circuit 70 can include one or more control logic unit. Each control logic unit described herein can be either a software module and/or a firmware module running on a processor, such as a microcontroller unit (MCU), which is part of control circuits 70, or a hardware module of a finite-state machine (FSM), such as an integrated circuit (IC, e.g., application-specific IC (ASIC), field-programmable gate array (FPGA), etc.), or a combination of software module, firmware module, and hardware module.

The voltage generator 65 can generate voltages to be supplied to word lines and bit lines under the control of the control circuit 70. The voltages generated by the voltage generator 65 include the read voltage $V_{read}$, the program voltage $V_{pgm}$, the pass voltage $V_{pass}$, the inhibit voltage $V_{inhibit}$, etc.

In some embodiments, the NAND flash memory 100 can be formed based on the floating gate technology. In some embodiments, the NAND flash memory 100 can be formed based on charge trapping technology. The NAND flash memory based on charge trapping can provide high storage density and high intrinsic reliability. Storage data or logic states (e.g., threshold voltage $V_{th}$ of the memory cell 340) depends on the amount of charge trapped in a storage layer. In some embodiments, the NAND flash memory 100 can be a three-dimensional (3D) memory device, where the memory cells 340 can be vertically stacked on top of each other. The structure and operation of a 3D flash memory is disclosed in U.S. Patent Application Publication U.S. Ser. No. 16/729,838, the entire disclosure of which is incorporated herein by reference.

Figure 2B:
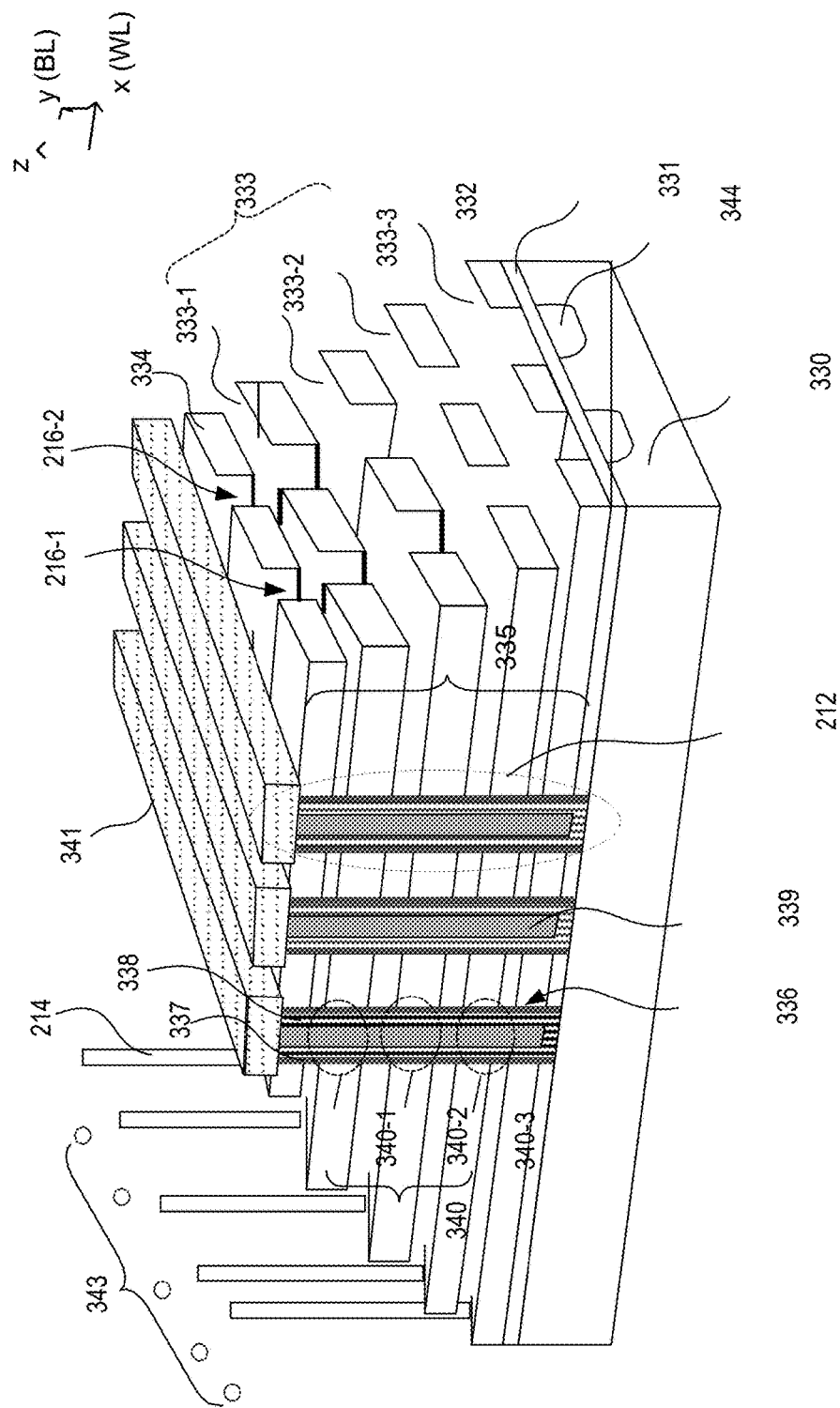
FIG. 2B illustrates a perspective view of a NAND flash memory, in accordance with some embodiments of the present disclosure.

FIG. 2B illustrates a perspective view of a portion of an exemplary NAND flash memory 100, according to some embodiments of the present disclosure. The NAND flash memory 100 includes a substrate 330, an insulating film 331 over the substrate 330, a tier of bottom select gates (BSGs) 332 over the insulating film 331, and tiers of control gates 333, also referred to as "word lines (WLs)," stacking on top of the BSGs 332 to form a film stack 335 of alternating conductive and dielectric layers. The dielectric layers adjacent to the tiers of control gates are not shown in FIG. 2B for clarity.

The control gates of each tier are separated by slit structures 216-1 and 216-2 through the film stack 335. The NAND flash memory 100 also includes a tier of top select gates (TSGs) 334 over the stack of control gates 333. The stack of TSG 334, control gates 333 and BSG 332 is also referred to as "gate electrodes". The NAND flash memory 100 further includes memory strings 212 and doped source line regions 344 in portions of substrate 330 between adjacent BSGs 332. Each memory string 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filler 339 surrounded by the channel layer 338. A memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel layer 338 of the memory cell. The NAND flash memory 100 further includes bit lines (BLs) 341 connected with the memory strings 212 over the TSGs 334. The NAND flash memory 100 also includes metal interconnect lines 343 connected with the gate electrodes through contact structures 214. The edge of the film stack 335 is configured in a shape of staircase to allow an electrical connection to each tier of the gate electrodes.

In FIG. 2B, for illustrative purposes, three tiers of control gates 333-1, 333-2, and 333-3 are shown together with one tier of TSG 334 and one tier of BSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The NAND flash memory 100 can also include other structures, for example, TSG cut, common source contact, array common source and dummy memory string. These structures are not shown in FIG. 2B for simplicity.

In a NAND flash memory, read and programming operations can be performed in a memory page 448, which includes all memory cells 340 sharing the same word line. In a NAND memory, the memory cell 340 can be in an erased state ER or a programmed state P1. Initially, all memory cells 340 in the memory array 103 can be reset to the erased state ER as logic "1" by implementing a negative voltage difference between the control gates 333 and source terminals of the memory cells (e.g., the array common source 446) such that all the trapped electronic charges in the storage layer of the memory cells 340 can be removed. For example, the negative voltage difference can be induced by setting the control gates 333 of the memory cells 340 to ground, and applying a high positive voltage to the array common source 446. At the erased state ER ("state ER"), the threshold voltage $V_{th}$ of the memory cells 340 can be reset to the lowest value, and can be measured or sensed at the bit line 341.

During programming (i.e., writing), a programming voltage $V_{pgm}$ (e.g., a positive voltage pulse between 10 V and 20 V) can be applied on the control gate 333 such that electronic charges (e.g., electrons) can be injected into the storage layer of the memory cell 340, and thereby increase the threshold voltage $V_{th}$ of the memory cell 340. Thus, the memory cell 340 is programmed to the state P1.

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states ("states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER, and states P1-P7. In the QLC mode, a memory cell stores 4 bits and has 16 states (i.e., state ER and states P1-P15). To summarize, a memory cell in an xLC mode can be programmed to $2^n$ states and can store n-bit of data, where n is a whole number. For example, n equals 1, 2, 3, and 4 for SLC, MLC, TLC and QLC mode, respectively.

Figure 3:
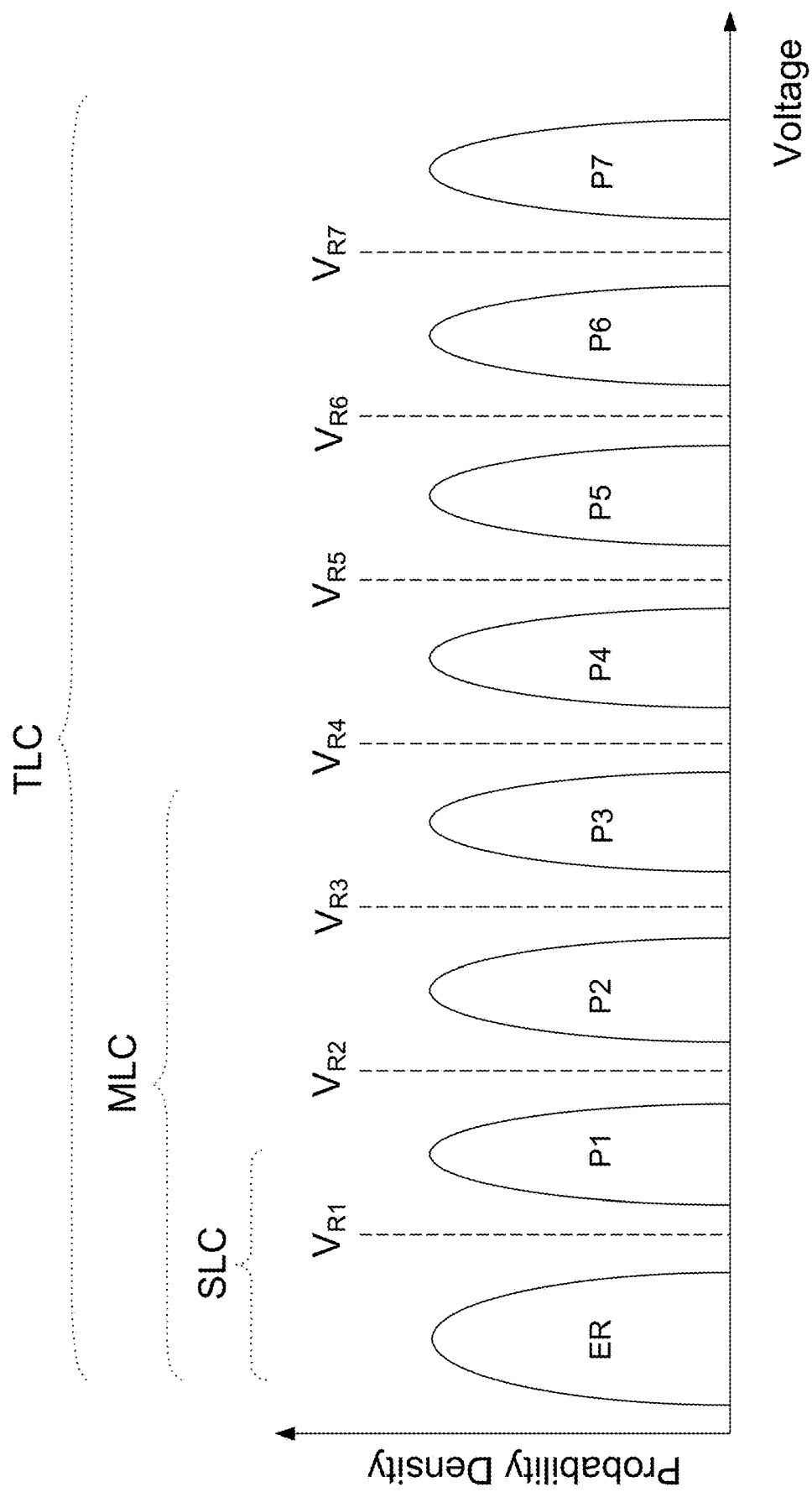
FIG. 3 illustrates a threshold voltage $V_{th}$ distribution of a NAND flash memory, according to some embodiments of the present disclosure.

FIG. 3 illustrates a threshold voltage $V_{th}$ distribution of a NAND flash memory programmed in the xLC mode, according to some embodiments of the present disclosure. Due to various variations, each state of the memory cells includes a range of threshold voltages $V_{th}$, where the threshold voltage $V_{th}$ distribution of each state can be represented by a probability density. In some embodiments, each state of the xLC mode (SLC, MLC, TLC, QLC, etc.) can be programmed by using an incremental step pulse programming (ISPP) scheme where the programming voltage $V_{pgm}$ can be incrementally increased by adding a step pulse $V_{step}$. For example, the eight TLC states can be programmed from the state ER to the state P1 with a lower threshold voltage first, and then to the state P7 with a highest threshold voltage. Likewise, sixteen QLC states (not shown in FIG. 3) can be programmed from the state P1 to the state P15, where the state P15 has a highest threshold voltage. In the xLC mode, the $2^n$ states can be programmed from the state EP to the state P1, P2, . . . P($2^n$–1) sequentially, where from the state P1 to the state P($2^n$–1), threshold voltage of the memory cell increases.

In some embodiments, to increase the programming speed, memory cells in the same memory page 448 (FIG. 2A) shared with the same word line (e.g., same control gates 333) can be programmed simultaneously. After each ISPP pulse, a verify read can be performed. In some embodiments, the memory cells which have reached a target state (i.e., a target threshold voltage) can be inhibited from further programming by controlling the TSG 334 and/or BSG 332. In some embodiments, memory cells can also be inhibited from further programming by raising the voltage on the corresponding bit lines.

Referring to FIG. 3, after programming, the eight TLC states ER and P1-P7 can be verified by using one or more read reference voltages $V_{R1}$-$V_{R7}$. By applying one or more of the read reference voltages $V_{R1}$-$V_{R7}$ to the control gate of a target memory cell, the range of the memory cell's threshold voltage $V_{th}$ can be determined. For example, to verify if a target memory cell 340 is at state ER, the read reference voltage $V_{R1}$ can be used. If the target memory cell is at state ER, the threshold voltage $V_{th}$ of the target memory cell is lower than the read reference voltage $V_{R1}$. The target memory cell can be switched on and form a conductive path in the channel. If the target memory cell is at any one of the states P1-P7, the threshold voltage $V_{th}$ of the target memory cell is higher than the read reference voltage $V_{R1}$. The target memory cell is thereby switched off. By measuring or sensing the current through the target memory cell at the corresponding bit line, the threshold voltage $V_{th}$ or the state of the target memory cell can be verified.

As described above, to determine the two states ER and P1 stored in the SLC mode, only the read reference voltage $V_{R1}$ is needed. To determine the four states ER and P1-P3 in the MLC mode, the read reference voltages $V_{R1}$, $V_{R2}$ and $V_{R3}$ can be used. To determine the eight states ER and P1-P7 for the TLC mode, the read reference voltages $V_{R1}$-$V_{R7}$ can be used. For example, in the TLC mode, the threshold voltage of state ER is below $V_{R1}$, and the threshold voltage of state P7 is above $V_{R7}$, where the threshold voltages of state P1 is between $V_{R1}$ and $V_{R2}$. States P2-P6 can be determined similarly. Likewise, in the QLC mode, 15 read reference voltages can be used to verify the 16 states (ER and P1-P15). To verify the $2^n$ states in the xLC mode, $2^n$–1 number of read reference voltages can be used. In some embodiments, an SLC read can be performed to separate two groups of logic states using a single read reference voltage. For example, by comparing threshold voltages of the memory cells with the read reference voltage $V_{R4}$, states ER and P1-P3 can be separated from states P4-P7.

In some embodiments, to improve reading and programming speed, multiple memory pages ("physical pages") can be read or programmed simultaneously. In MLC, TLC or QLC mode, each memory page can be read or programmed based on one or more logic pages. For example, in the TLC mode of 3 bits per memory cell, a memory page can be programmed based on 3 logic pages, e.g., a lower page, a middle page and an upper page, corresponding to each of the 3 bits. In the QLC mode of 4 bits per memory cell, a memory page can be programmed based on 4 logic pages, e.g., a lower page, a middle page, an upper page and a top page corresponding to each of the 4 bits. In the xLC mode where each memory cell can store n-bit, a memory page can be programmed based on n logic pages that correspond to the n bits.

FIGS. 4A-4D illustrate mapping schemes of logic pages and the states of a NAND flash memory, according to some embodiments of the present disclosure. In some embodiments, the $2^n$ state of an n-bit memory cell can be represented in the form of a gray code. A gray code, i.e., reflected binary code (RBC) or reflected binary (RB), is an ordering of the binary numeral system such that two successive values differ in only one bit (binary digit). FIG. 4A shows an exemplary binary code representation of the eight states (states ER and P1-P7) in the TLC mode. For example, state ER can correspond to a 3-bit binary code (111), while states P1-P7 correspond to (110), (100), (000), (010), (011), (001) and (101), respectively.

In FIG. 4B, the eight states ER and P1-P7 of the TLC mode can be mapped, using another mapping scheme, into binary codes (111), (000), (001), (010), (100), (011), (101) and (110), respectively. The 3 bits of the binary codes can be named as a most significant bit (MSB), a center significant bit (CSB), and a least significant bit (LSB), reading from left to right. For example, the state P5 can be mapped to the binary code (011), where the MSB, CSB and LSB are "0," "1," and "1," respectively. In some embodiments, the memory cells in the same memory page can be read or programmed simultaneously. Therefore, each memory page of TLC mode can be programmed by using programming data from 3 logic pages, i.e., the lower page, the middle page and the upper page, corresponding to the LSB, CSB and MSB of the binary codes, respectively. Each memory cell in the memory page can be programmed to a target logic state ("state") according to the binary codes received in the logic pages. During programming, the logic pages of programming data can be stored in the page buffers 50 (FIGS. 1A and 2A) before sending to the memory page of the NAND flash memory 100.

It is noted that the mapping scheme of FIG. 4B may not be the traditional mapping scheme of the logic pages where states can be verified with minimum steps. The mapping scheme shown in FIG. 4B can be generated after data pre-processing such that the total number of page buffer operations is reduced and thereby the overall programming performance of the NAND flash memory can be improved. It is noted that the scope of the present disclosure is not limited to the mapping scheme illustrated in FIG. 4B. The method disclosed herein can be applied to a different set of binary codes associated with the states ER and P1-P7. The method can also be applied to a different programming mode, for example, SLC, MLC and/or QLC. FIGS. 4C and 4D illustrate mapping schemes of binary codes to the sixteen QLC states, according to some embodiments of the present disclosure. In FIG. 4C, a gray code scheme can be used to represent each of the sixteen states (ER, P1-P15). In FIG. 4D, like the scheme used in FIG. 4B, pre-processed data or binary codes can be used to present the sixteen states of the QLC mode. In general, for n-bit memory cells, pre-processed binary codes can be used to represent the $2^n$ states of the xLC mode such that the total number of page buffer operations can be reduced and thereby the overall programming performance of the NAND flash memory can be improved.

Figure 5:
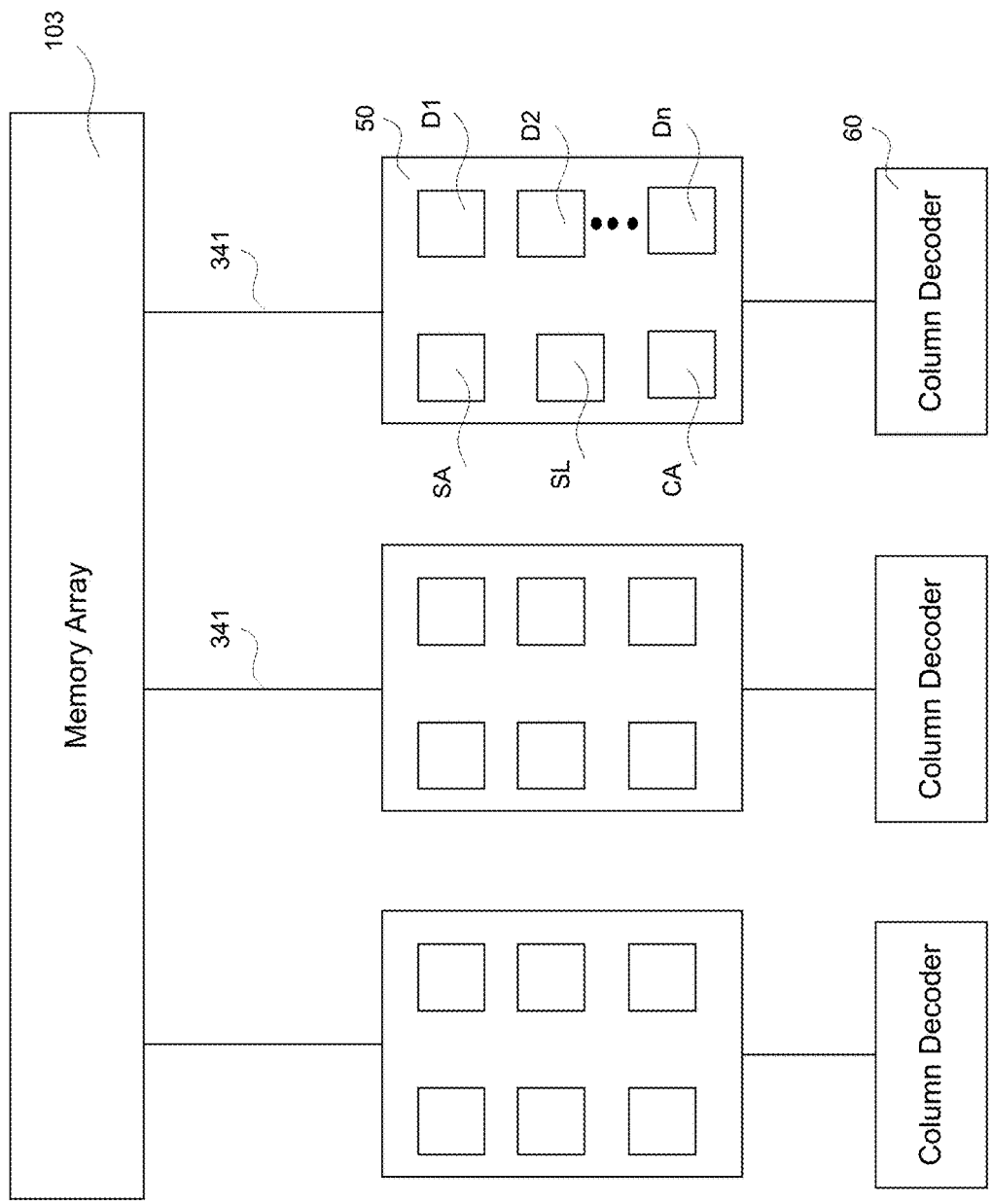
FIG. 5 illustrates a block diagram of page buffers, according to some embodiments of the present disclosure.

FIG. 5 illustrates a block diagram of the page buffers 50 for the NAND flash memory 100 in FIG. 1A, according to some embodiments of the present disclosure. In this example, each page buffer/sense amplifier 50 (also referred to as page buffer 50) can be coupled to one bit line 341 of the memory array 103. Referring to FIG. 2A, each memory string 212 is coupled with a bit line 341. Accordingly, the memory cells 340 on the memory string 212 can be coupled with at least one page buffer 50. The memory cells 340 of the memory page 448 can be coupled with a plurality of page buffers 50 through corresponding bit lines 341. The page buffers 50 can temporarily store data for the memory cells in the memory array 103, and then output the stored data, for example, to a column decoder 60. The page buffer 50 can also receive data and then provides the received data to the memory cells.

In some embodiments, each page buffer 50 can include one or more latches. In one example, the page buffer 50 can include six latches: latches D1-D3, latch SA, latch SL and cache latch CA to implement TLC mode. Each of the six latches can include two inverters made by, for example, complementary MOSFETs (i.e., CMOS) devices. Each latch can store 1 bit. To implement QLC mode, each page buffer 50 can include seven latches: latches D1-D4, latch SA, latch SL and cache latch CA. To implement xLC mode for n-bit memory cells, each page buffer 50 can include n+3 number of latches, i.e., n number of data latches D1-Dn and 3 non-data latches such as latch SA, latch SL and cache latch CA. The latches D1-Dn can be used to store the binary codes or programming data that represent the states of the memory cells, and therefore are also referred to data latches. As such, each page buffer 50 having n number of data latches D1-Dn can store n bits, where each data latch D1-Dn stores one bit. A plurality of page buffers 50 that are coupled to memory cells of a memory page can therefore store n number of logic pages that are used for programming the memory page. In other words, to program n-bit memory cells for xLC mode, the plurality of page buffers 50 can be used to store n number of logic pages.

FIGS. 6A and 6B illustrate exemplary cache usages of the page buffer 50, according to some embodiments of the present disclosure. For example, the lower page, middle page and the upper page for the TLC mode in FIG. 4B can be stored in the latches D1-D3, respectively. For the QLC mode in FIG. 4D, the lower page, middle page, upper page and the top page can be stored in the latches D1-D4, respectively. For each memory cell storing n-bit as implemented with xLC mode, binary bits from the LSB (i.e., the $1^{st}$ bit) to MSB (i.e., the nth bit) can be stored in the latches D1, D2, Dn.

In some embodiments, the cache latch CA stores inhibit information to control whether the memory cell is inhibited for programming. In some embodiments, the latch SA can store information indicating whether the current operation is a read operation or a programming operation. In some embodiments, the latch SA can store the data measured (or sensed) at the bit line from the sense amplifier, and is also referred to as sensing latch. Latch SL (also referred to as control latch) can store 3-bit-line (3BL) information, which can be used to select one of three voltage levels for a respective bit line 316 during the programming operation such that the threshold voltage distributions can be optimized.

Referring to FIGS. 3-5, in some embodiments, the page buffer 50 can include more data latches or control latches. In some embodiments, the page buffer 50 can include a storage unit other than a latch.

In some embodiments, each memory cell can have $2^n$ logic states and can store n bits. The programming data can include n logic pages to program a plurality of memory cells in the same memory page. In this example, each page buffer can include n data latches to store n bits.

In some embodiments, the n logic pages of programming data can be sent to the plurality of memory cells of the same memory page for programming the memory cells of the memory page at the same time. During the programming operation, the n logic pages of programming data can be stored in the corresponding n data latches of the page buffers.

Referring to FIG. 1A, during a programming (writing) operation, the host computer 15 does not usually store the programming data after sending it to the NAND flash memory 100. To prevent data loss in event the eventrogram status failure, the NAND flash memory 100 typically stores the original programming data in the page buffers 50 throughout the entire programming (i.e., write) operation. For example, when a plurality of memory cells of the same memory page are programmed, the n logic pages of programming data can be stored in the corresponding n data latches of the page buffers until all the target states have been successfully programmed and verified for the plurality of memory cells of the same memory page. In case of programming failure, the n logic pages of programming data can be resent to the plurality of memory cells of the same memory page. In other words, in case of programming failure, the original programming data can be recovered. New programming data can be sent to the page buffers after the current programming operation is completed and the programmed data in the memory cells are verified.

However, the duration of the entire programming and verification operation can increase significantly for a NAND flash memory programmed in MLC, TLC or QLC mode. Additionally, data-in time for loading new programming data can be long. For example, for a memory die with 4 memory planes, data-in time can be on the order of 100 μs assuming I/O speed of memory controller 20 (FIG. 1A) as 2.0 Gbps. This data-in time can be even longer for slower I/O speed. To improve programming speed for the storage system 10, it is necessary to implement cache programming in the page buffer. With cache programming, data-in time can be hidden in NAND busy time (e.g., programming time $t_{PROG}$). Namely, loading new programming data can be performed in parallel with a programming operation.

For example, the original (current) programming data do not need to be stored in the latches of the page buffer during the entire programming operation, and can be discarded gradually. In some embodiments, after some lower states are programmed successfully, latches storing one or more logic pages can be vacated (or released). After successful completion of programming more states (or levels), more logic pages of original programming data can be released. If the programming operation fails, the original programming data stored in the one or more logic pages can be recovered nevertheless.

In one example, in TLC mode, when the states P1-P4 are successfully programmed, the upper page data stored in the latch D3 can be discarded, as described in detail below.

Figure 7:
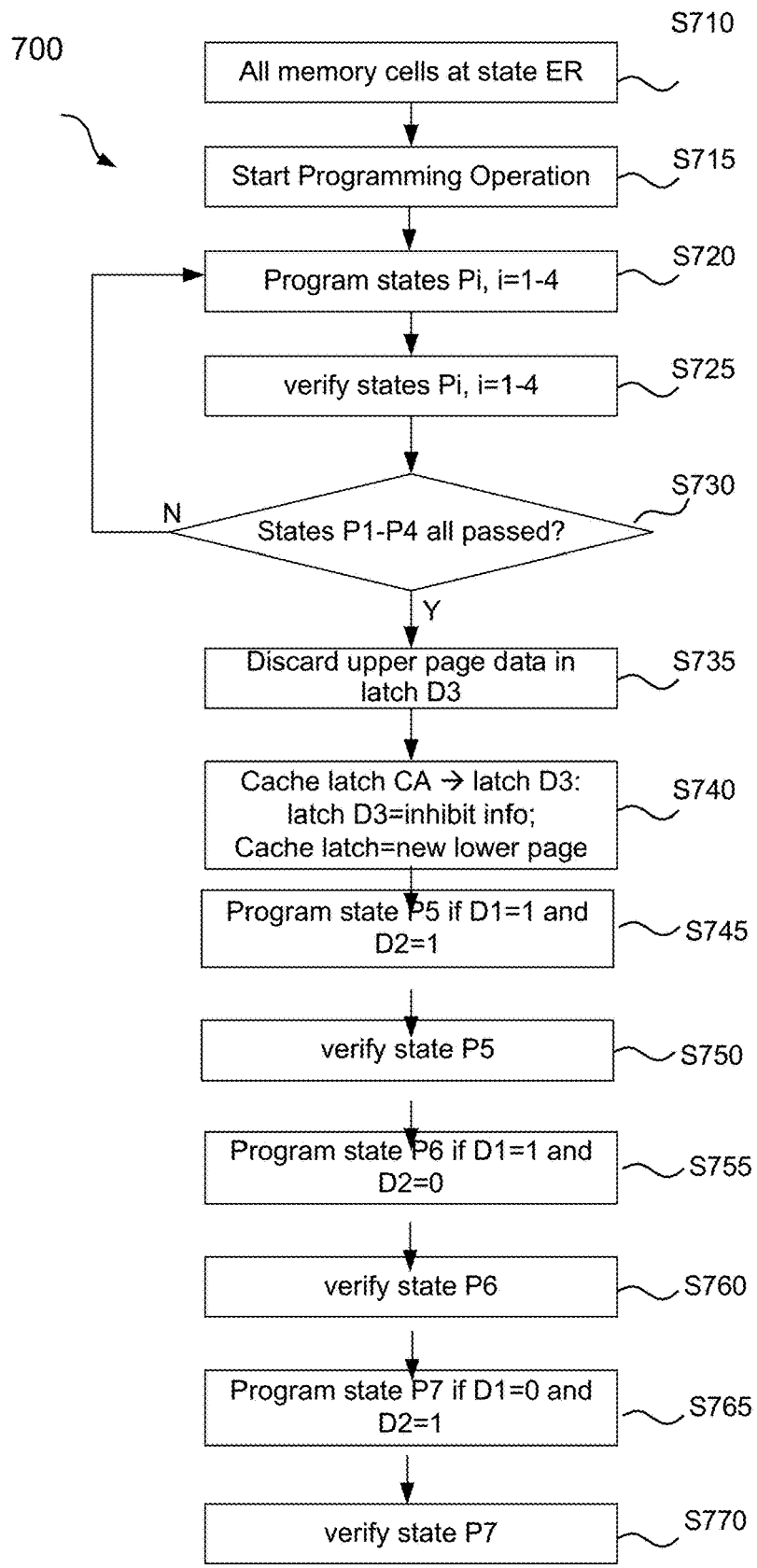
FIG. 7 illustrates a flow diagram of a method of cache programing for a NAND flash memory, according to some embodiments of the present disclosure.

FIG. 7 illustrates a flow diagram of a method 700 for cache programing for a NAND flash memory, according to some embodiments of the present disclosure. It should be understood that the method 700 is not exhaustive and that other operation steps can be performed as well before, after, or between any of the illustrated operation steps. In some embodiments, some operation steps of method 700 can be omitted or other operation steps can be included, which are not described here for simplicity. In some embodiments, operation steps of method 700 can be performed in a different order and/or vary.

The method 700 starts at operation step S710, where all the memory cells in the memory array are at the erased state ER with the lowest threshold voltages $V_{th}$.

Next, at operation step S715, a programming operation is started to program the memory cells in the same memory page in the TLC mode, for example. In some embodiments, the eight TLC states can be programmed and verified sequentially from a low state (e.g., state P1) to a high state (e.g., state P7), where the MSB, CSB and LSB of the binary codes for the TLC mode are mapped to the logic page of upper page, middle page and lower page, and stored in the latches of D3, D2 and D1 in the page buffer 50 using mapping scheme described in FIG. 4B.

At operation step S720, lower states P1-P4 are programmed sequentially to the memory cells and the states (or threshold voltages $V_{th}$) are verified at operation step S725 accordingly.

At operation step S730, it is checked if all the states P1-P4 have been programmed successfully (i.e., passed). If not, then the method 700 can be routed back to the operation step S720 to continue programming the target state.

Figure 8:
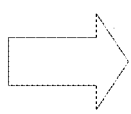
FIG. 8 illustrates a mapping and recovery scheme of logic pages, according to some embodiments of the present disclosure.

If all the states P1-P4 have been programmed successfully, operation step S735 can be performed, where the upper page of the current programming data can be discarded and the latch D3 can be vacated. Referring to FIGS. 4B and 8, if all the states P1-P4 are successfully programmed, the remaining states P5-P7 have distinguished binary codes and can be determined based only from lower page and middle page. For example, state P5 corresponds to a binary code (11), where both the middle page and lower page bits are "1". State P6 corresponds to a binary code (01), where the middle page and lower page bits are "0" and "1," respectively. State P7 corresponds to a binary code (10), where the middle page and lower page bits are "1" and "0," respectively. Therefore, these three states P5, P6 and P7 can be determined without relying on the upper page data. Thus, the upper page can be removed from the latch D3. Accordingly, the vacated latch D3 can be used for other storage purpose while the programming of higher states P5-P7 continues.

At operation step S740, for example, original data (e.g., inhibit information in FIG. 6A) in the cache latch CA can be transferred to the vacated latch D3. In the meantime, a lower page of a new programming data ("new lower page") can be loaded to the cache latch CA. The new cache usage of the page buffer is illustrated in FIG. 9.

At operation step S745, state P5 can be programmed if the lower page and middle page of the current programming data stored in the respective latch D1 and D2 are both "1"s. The programmed state P5 can then be verified at operation step S750.

If the lower page and middle page are "1" and "0", respectively, state P6 can be programmed at operation step S755. The programmed state P6 can be verified at operation step S760.

If the lower page and middle page are "0" and "1," respectively, state P7 can be programmed at operation step S765. The programmed state P7 can be verified at operations step S770.

When a programming operation fails, a programming failure signal, for example, a status (e.g., a 2-bit status code) can be generated to indicate which states have passed programming. For example, a code (11) can be generated to represent programming failure before the state P4. A code (10) can be generated to represent programming failure after state P4 passes and before state P6 passes. A code (01) can be generated to represent programming failure after state P6 passes and before state P7 passes. A code (00) can be generated to represent all states pass programming and verification.

If there is a programming failure, for example, detected at the operation step S750, S760 or S770, the original programming data (i.e., upper page) previously stored in the latch D3 can be recovered.

Figure 10:
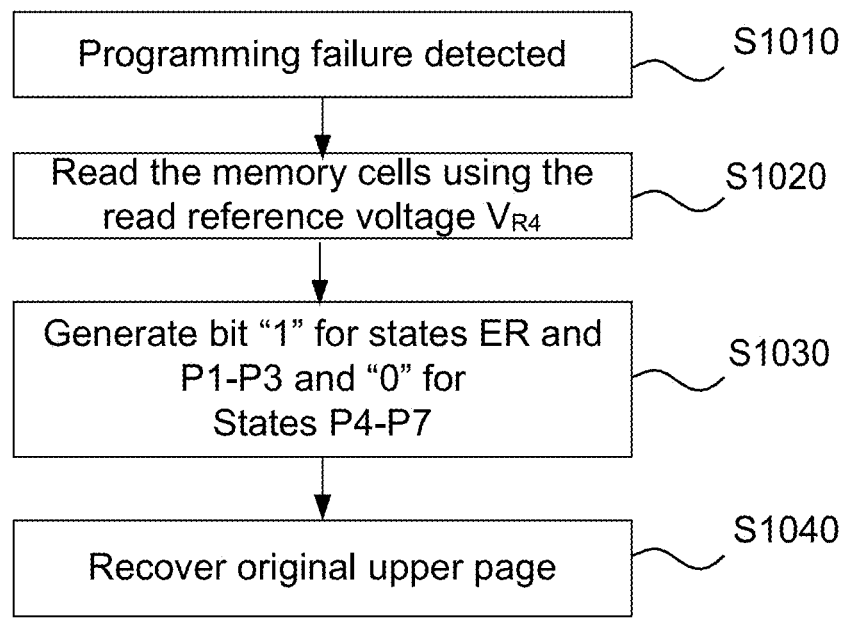
FIG. 10 illustrate a recovering method for a latch in a page buffer, according to some embodiments of the present disclosure.

FIG. 10 illustrates a recovering method 1000 for the latch D3, according to some embodiments of the present disclosure. It should be understood that the recovering method 1000 is not exhaustive and that other operation steps can be performed as well before, after, or between any of the illustrated operation steps. In some embodiments, some operation steps of the recovering method 1000 can be omitted or other operation steps can be included, which are not described here for simplicity. In some embodiments, operation steps of the recovering method 1000 can be performed in a different order and/or vary.

The recovering method 1000 starts at operation step S1010, where a programming failure is detected or a failure flag (or a 2-bit status code) is received. If the programming failure occurs before state P4 passes, e.g., at step S730 in FIG. 7 and the code (11) is received, the current programming data are still stored in latches D1-D3 and therefore can be recovered easily.

If during the programming of states P5-P7, a failure occurs at, e.g., the operation step S750, S760 or S770 in FIG. 7, data recovering follows the method 1000 to the next step in FIG. 10.

At operation S1020, the read reference voltage $V_{R4}$ can be used to perform a read operation on the memory cells. Referring to FIG. 3, states ER and P1-P3 have threshold voltages $V_{th}$ lower than the read reference voltage $V_{R4}$ and the states P4-P7 have threshold voltages $V_{th}$ higher than the read reference voltage $V_{R4}$. Therefore, the states ER and P1-P3 can be separated from the states P4-P7 by, for example, sensing current at the corresponding bit line.

At operation step 1030, a bit of "1" can be constructed for the states ER and P1-P3, and a bit of "0" can be constructed for the states P4-P5. In some embodiments, the constructed single bit (referred to as the "SLC read") can be stored in the latch SA coupled to the memory cell of the corresponding state. The SLC read is also illustrated in FIG. 8.

At operation step 1040, the original upper page stored in the latch D3 can be recovered for all the eight TLC states ER and P1-P7. As previously discussed, the states ER and P1-P3 can be separated from the states P4-P7 based on the SLC read. Each state within the two groups can be determined and distinguished solely based on the data in the lower page and the middle page. For example, in the group of states P4-P7, the lower page and middle page for state P4 are both "0"s, and are both "1"s for state P5. The lower page and middle page for state P6 are "1" and "0," respectively. The lower page and middle page for state P7 are "0" and "1," respectively. Therefore, the upper page for states P4-P7 can be determined and recovered according to the pre-determined mapping scheme in FIG. 4B. Similarly, the upper page data for states ER and P1-P3 can also be recovered according to the pre-determined mapping scheme in FIG. 4B. For example, the lower page and middle page for state ER are both "1"s, and are both "0"s for state P1. The lower page and middle page for state P2 are "1" and "0," respectively. The lower page and middle page for state P3 are "0" and "1," respectively. The constructed upper page is shown in FIG. 8. Compared with FIG. 4B, the original (current) programming data in upper page is therefore recovered.

In another example, when the states P1-P6 are successfully programmed, the lower page data stored in the latch D1 can also be discarded, as described in detail below.

Figure 11:
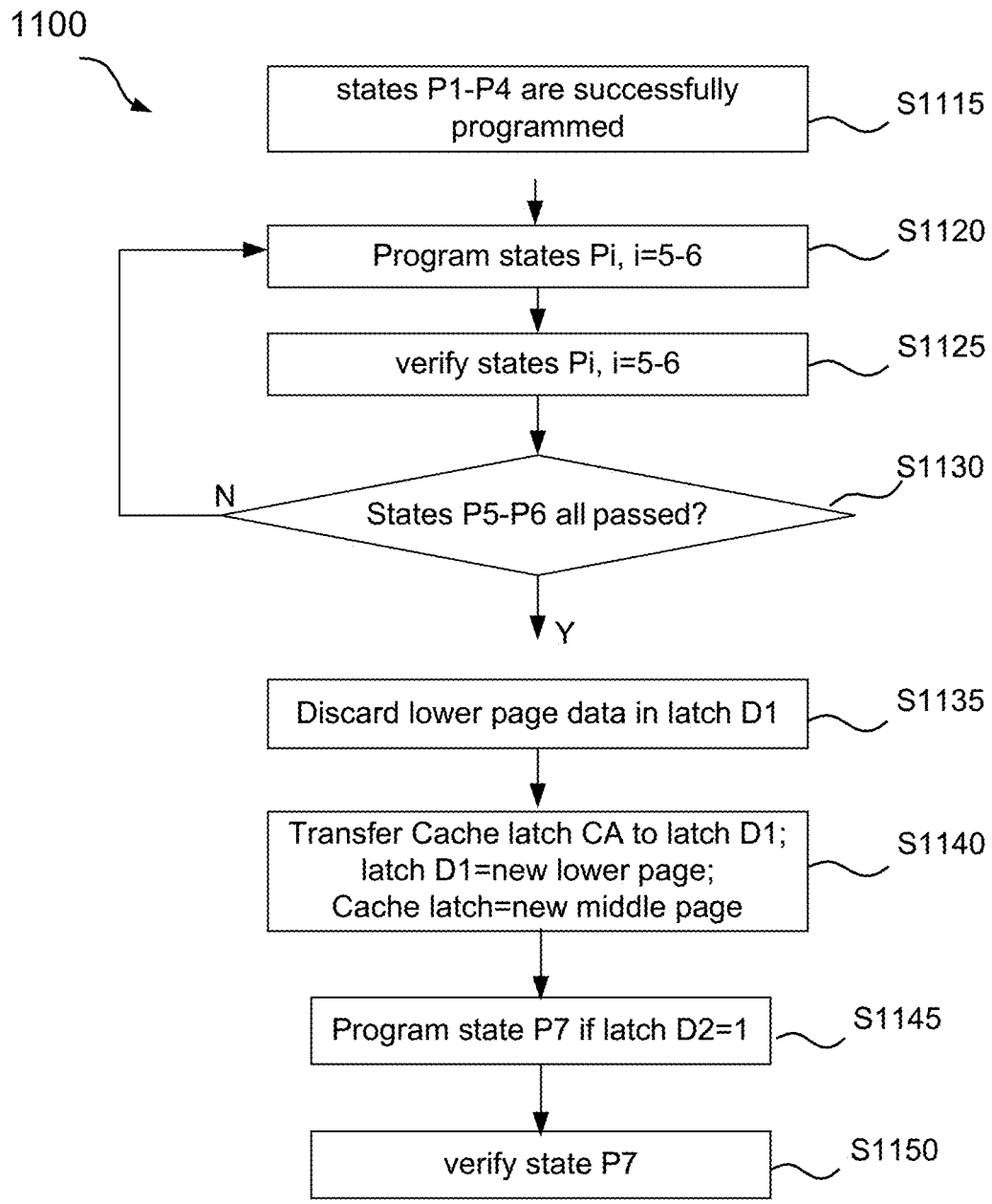
FIG. 11 illustrates a flow diagram of a method for cache programing for a NAND flash memory, according to some embodiments of the present disclosure.

FIG. 11 illustrates a flow diagram of a method 1100 for cache programing for a NAND flash memory, according to some embodiments of the present disclosure. It should be understood that the method 1100 is not exhaustive and that other operation steps can be performed as well before, after, or between any of the illustrated operation steps. In some embodiments, some operation steps of method 1100 can be omitted or other operation steps can be included, which are not described here for simplicity. In some embodiments, operation steps of method 1100 can be performed in a different order and/or vary.

The method 1100 starts at operation step S1115, where the states P1-P4 have been successfully programmed and cache programming is optimized according to method 700 discussed previously.

At operation step S1120, states P5-P6 are programmed sequentially to the memory cells and the states (or threshold voltages $V_{th}$) are verified at operation step S1125 accordingly.

At operation step S1130, it is checked if the states P5-P6 have been programmed successfully (i.e., passed). If not, then the method 1100 can be routed back to the operation step S1120 to continue programming the target state.

Figure 12:
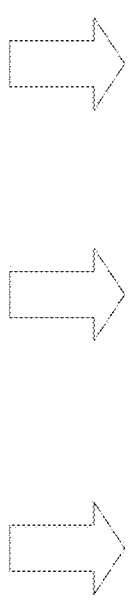
FIG. 12 illustrates a mapping and recovery scheme of logic pages, according to some embodiments of the present disclosure.

If the states P5-P6 have been programmed successfully, i.e., all the states P1-P6 are passed verification, operation step S1135 can be performed, where the lower page of the current programming data can be discarded and the latch D1 can be vacated. Referring to FIGS. 4B and 12, if all the states P1-P6 are successfully programmed, the remaining state P7 can be determined solely from the middle page, i.e., the middle page of the state P7 corresponds to logic "1." Thus, the lower page of current programming data can be removed from the latch D1. Accordingly, the vacated latch D1 can be used for other storage purposes while programming the state P7.

At operation step S1140, for example, the new lower page stored in the cache latch CA at operation step S740 in FIG. 7, can be transferred to the vacated latch D1. In the meantime, a middle page of the new programming data ("new middle page") can be uploaded to the cache latch CA. The new cache usage of the page buffer is illustrated in FIG. 13.

At operation step S1145, if the middle page stored in the latch D2 is "1", then state P7 can be programmed.

Next, at operation step S1150, the state P7 is verified at the memory cells. If the target state is not reached, operation step S1145 can be repeated. If the target state is reached, the programming operation is completed.

Similar to the recovering method 1000, if there is a programming failure, for example, detected at the operation step S1150, the original programming data, i.e., the lower page and the upper page stored in the respective latch D1 and latch D3 can be recovered.

Figure 14:
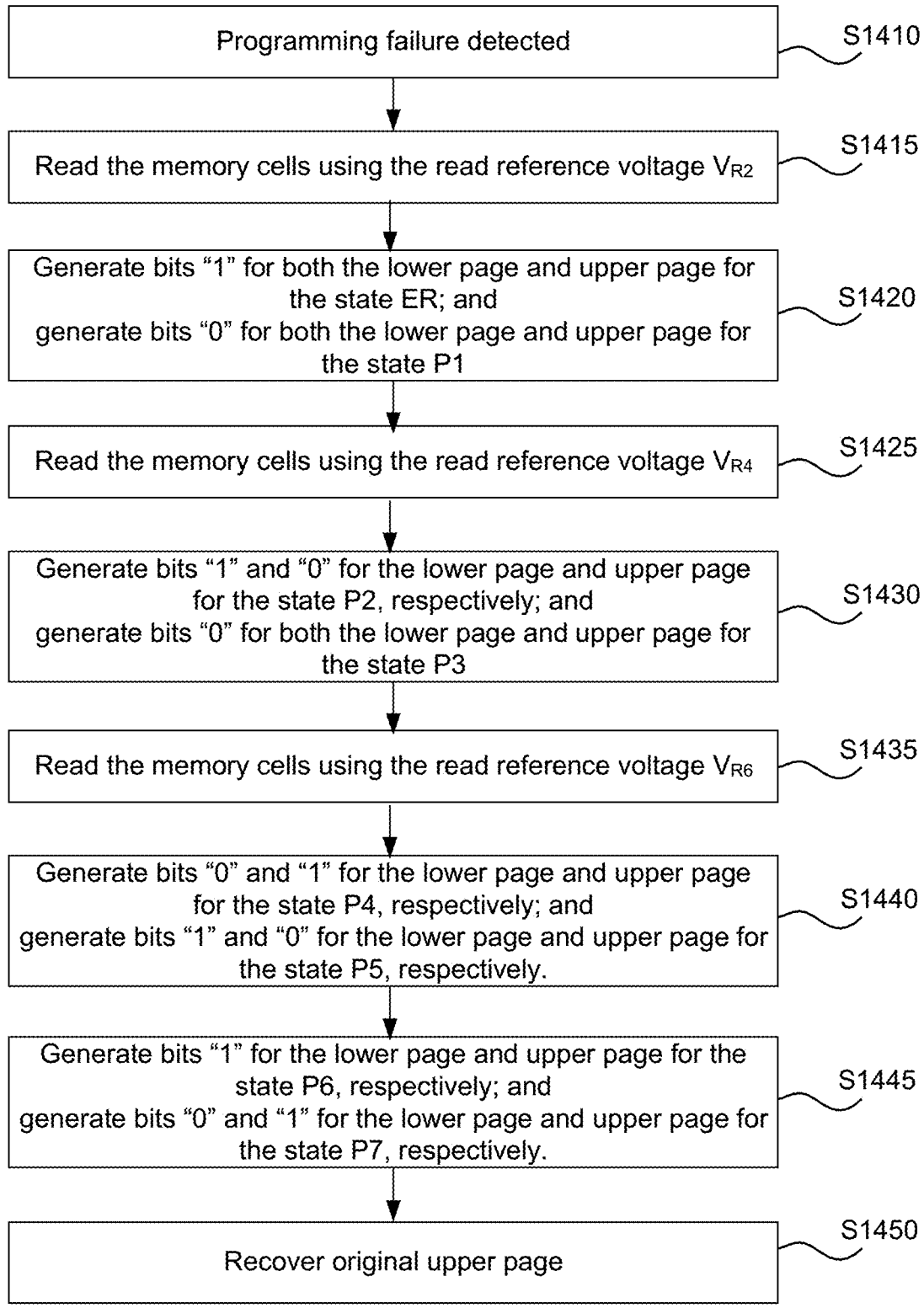
FIG. 14 illustrates a recovering method for latches in a page buffer, according to some embodiments of the present disclosure.

FIG. 14 illustrates a recovering method 1400 for the latch D1 and latch D3, according to some embodiments of the present disclosure. It should be understood that the recovering method 1400 is not exhaustive and that other operation steps can be performed as well before, after, or between any of the illustrated operation steps. In some embodiments, some operation steps of the recovering method 1400 can be omitted or other operation steps can be included, which are not described here for simplicity. In some embodiments, operation steps of the recovering method 1400 can be performed in a different order and/or vary.

The recovering method 1400 starts at operation step S1410, where a programming failure for the state P7 is detected at operation step S1150 in FIG. 11, where the programming failure signal (e.g., a failure flag) can be received. For example, the 2-bit status code of (01) is received.

At operation S1415, the read reference voltage $V_{R2}$ can be used to perform a read operation on the memory cells. Referring to FIG. 3, states ER and P1 have threshold voltages $V_{th}$ lower than the read reference voltage $V_{R2}$ and the states P2-P7 have threshold voltages $V_{th}$ higher than the read reference voltage $V_{R2}$. Therefore, the states ER and P1 can be separated from the states P2-P7.

Referring to FIGS. 4B and 12, the states ER and P1 can be determined based on their middle page of current programming data, i.e., the middle page stored in latch D2 are "1" and "0" for state ER and P1, respectively. According to the pre-determined mapping scheme in FIG. 4B, at operation step 1420, bits "1" can be generated for both the lower page and upper page of the state ER. And bits "0" can be generated for both the lower page and upper page of the state P1.

At operation S1425, the read reference voltage $V_{R4}$ can be used to perform a read operation on the memory cells. Referring to FIG. 3, states ER and P1-P3 have threshold voltages $V_{th}$ lower than the read reference voltage $V_{R4}$ and the states P4-P7 have threshold voltages $V_{th}$ higher than the read reference voltage $V_{R4}$. Therefore, the states ER and P1-P3 can be separated from the states P4-P7. Since the lower page and the upper page of the states ER and P1 have been reconstructed at the previous step, the lower page and the upper page of states P2 and P3 can be recovered.

Referring to FIGS. 4B and 12, the states P2 and P3 can be determined based on their middle page data, i.e., the middle page stored in latch D2 are "0" and "1" for state P2 and P3, respectively. According to the pre-determined mapping scheme in FIG. 4B, at operation step 1430, bits "1" and "0" can be generated for the lower page and upper page of the state P2, respectively. Similarly, bits "0" can be generated for both the lower page and upper page of the state P3.

At operation S1435, the read reference voltage $V_{R6}$ can be used to perform a read operation on the memory cells. Referring to FIG. 3, states ER and P1-P5 have threshold voltages $V_{th}$ lower than the read reference voltage $V_{R6}$ and the states P6-P7 have threshold voltages $V_{th}$ higher than the read reference voltage $V_{R6}$. Therefore, the states ER and P1-P5 can be separated from the states P6-P7. Since the lower page and the upper page of the states ER and P1-P3 have been reconstructed at the previous steps, the lower page and the upper page of states P4 and P5 can be recovered.

Referring to FIGS. 4B and 12, the state P4 and the state P5 can be determined based on their middle page data, i.e., the middle page stored in latch D2 are "0" and "1" for state P4 and P5, respectively. According to the pre-determined mapping scheme in FIG. 4B, at operation step 1440, bits "0" and "1" can be generated for the lower page and upper page of the state P4, respectively. Similarly, bits "1" and "0" can be generated for the lower page and upper page of the state P5, respectively.

In the meantime, at operation step S1445, the lower page and the upper page of states P6 and P7 can be recovered.

Referring to FIGS. 4B and 12, the state P6 and P7 can be determined based on their middle page data, i.e., the middle page stored in latch D2 are "0" and "1" for state P6 and P7, respectively. According to the pre-determined mapping scheme in FIG. 4B, at operation step 1445, bits "1" can be generated for both the lower page and upper page of the state P6. Similarly, bits "0" and "1" can be generated for the lower page and upper page of the state P7, respectively.

At operation step 1450, the original lower page and upper page stored in the latch D1 and latch D3 can be fully recovered for all the eight TLC states ER and P1-P7.

FIG. 15 illustrates an exemplary cache usage of the page buffer after the states P1-P6 have been successfully programmed, according to some embodiments of the present disclosure. In this example, the 3BL information stored in the latch SL can also be discarded, for example, as the read margin and distribution width of the last state P7 can be less critical compared with other states. Accordingly, latch SL can be vacated and ready for loading data for other purposes. In some embodiments, the new middle page stored in the cache latch CA at operation step S1140 discussed previously (FIGS. 11 and 13) can be transferred to the latch SL. An upper page of the new programming data ("new upper page") can be loaded to the cache latch CA.

In some embodiments, the middle page of the original programming data stored in the latch D2 can be discarded after all the states P1-P7 are programmed successfully. The new upper page can be loaded to the page buffer accordingly. For example, the new upper page can be uploaded to the latch D2. In another example, the new upper page can be uploaded to the cache latch CA after the new middle page transferred to the latch D2. In this example, loading time of the new upper page can be hidden within program discharge and epilogue time.

Figure 16A:
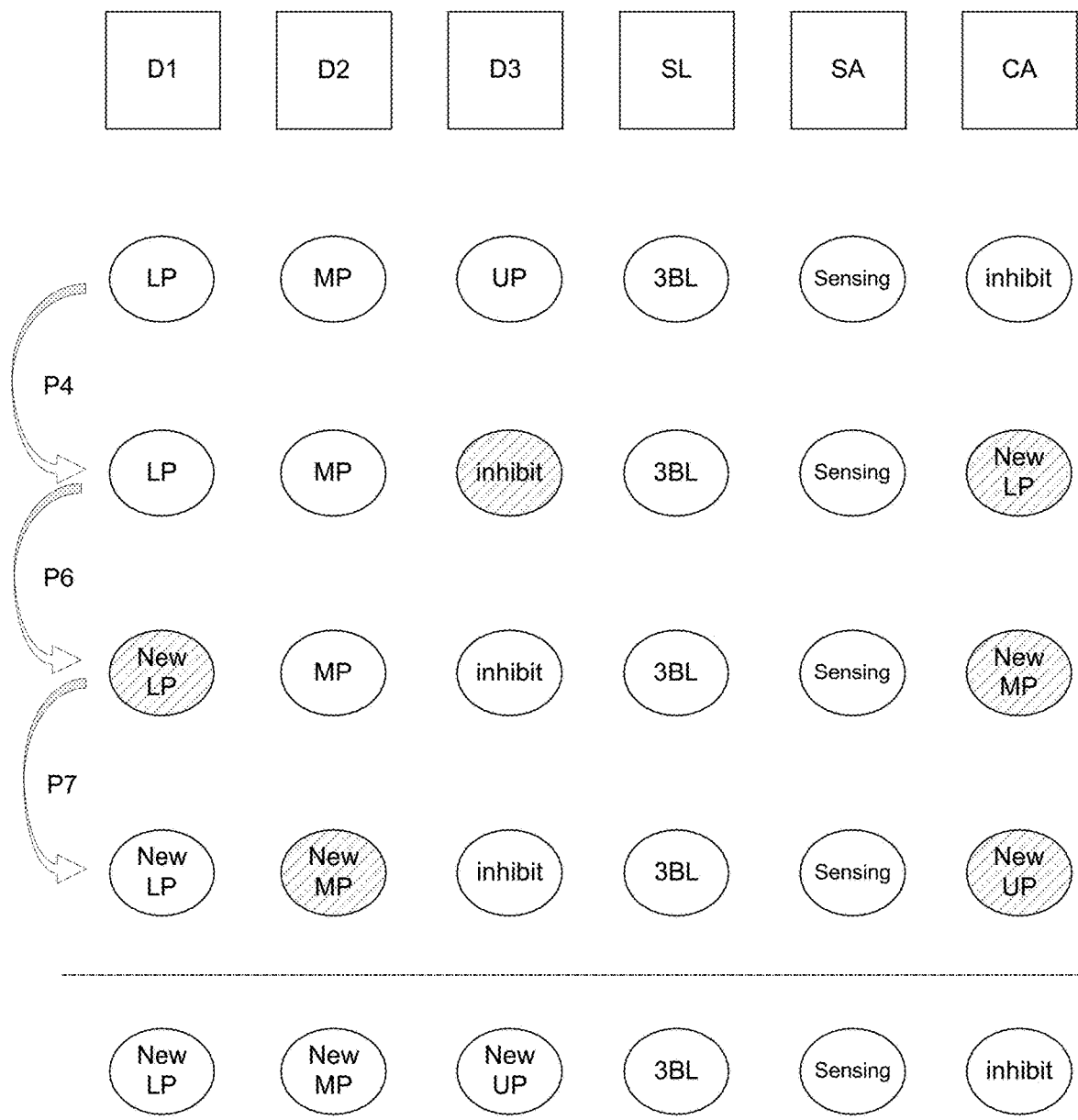
FIGS. 16A-16B and 17 illustrate schemes of cache programming, according to some embodiments of the present disclosure.

FIG. 16A summarizes cache programming for a NAND memory device in the TLC mode (i.e., 3-bit memory cell with 8 logic states), according to some embodiments of the present disclosure. As discussed previously, when programming from state ER to state P1, P2, P3 or P4, the data latches D1-D3 store respective bit of the current programming data (corresponding to, e.g., the lower page (LP), the middle page (MP) and the upper page (UP)), while the latches SL, SA and CA store 3BL information, sensing information and inhibit information. After states P1-P4 all have been successfully programmed, the upper page stored in the latch D3 can be discarded (or released) and the inhibit information can be transferred from the cache latch CA to the latch D3. The new lower page can be uploaded to the cache latch CA. See also FIGS. 7-9. The shaded circles show status changes. If there is a programming failure after states P1-P4 pass verification but before state P6 passes verification, the upper page originally stored in latch D3 can be recovered by using the read reference voltage $V_{R4}$, as explained with respect to FIGS. 8 and 10. After states P5 and P6 have been successfully programmed, i.e., after states P1-P6 all have been successfully programmed, the lower page stored in latch D1 can also be released. The new lower page can be transferred from the cache latch CA to the latch D1, and a new middle page can be loaded to the cache latch CA. See also FIGS. 11-13. If there is a programming failure after states P1-P6 pass verification but before state P7 passes verification, the upper page and the lower page originally stored in latches D1 and D3 can be recovered by using the read reference voltages $V_{R2}$, $V_{R4}$ and $V_{R6}$, as explained with respect to FIGS. 12 and 14. A new upper page can be uploaded in two ways. First, 3BL information can be discarded after successfully programming states P1-P6 where programming state P7 does not rely on 3BL information (shown in FIG. 15, not shown in FIG. 16A). Second, after state P7 is successfully programmed, i.e., after states P1-P7 all have been successfully programmed, the middle page stored in the latch D2 can also be released. The new middle page can be transferred from the cache latch CA to the latch D2, and a new upper page can be loaded to cache latch CA. The next cycle of programming starts again with latches D1-D3 loaded with the new lower page, the new middle page and the new upper page while the latches SL, SA and CA are loaded with 3BL, sensing and inhibit information, respectively.

Figure 16B:
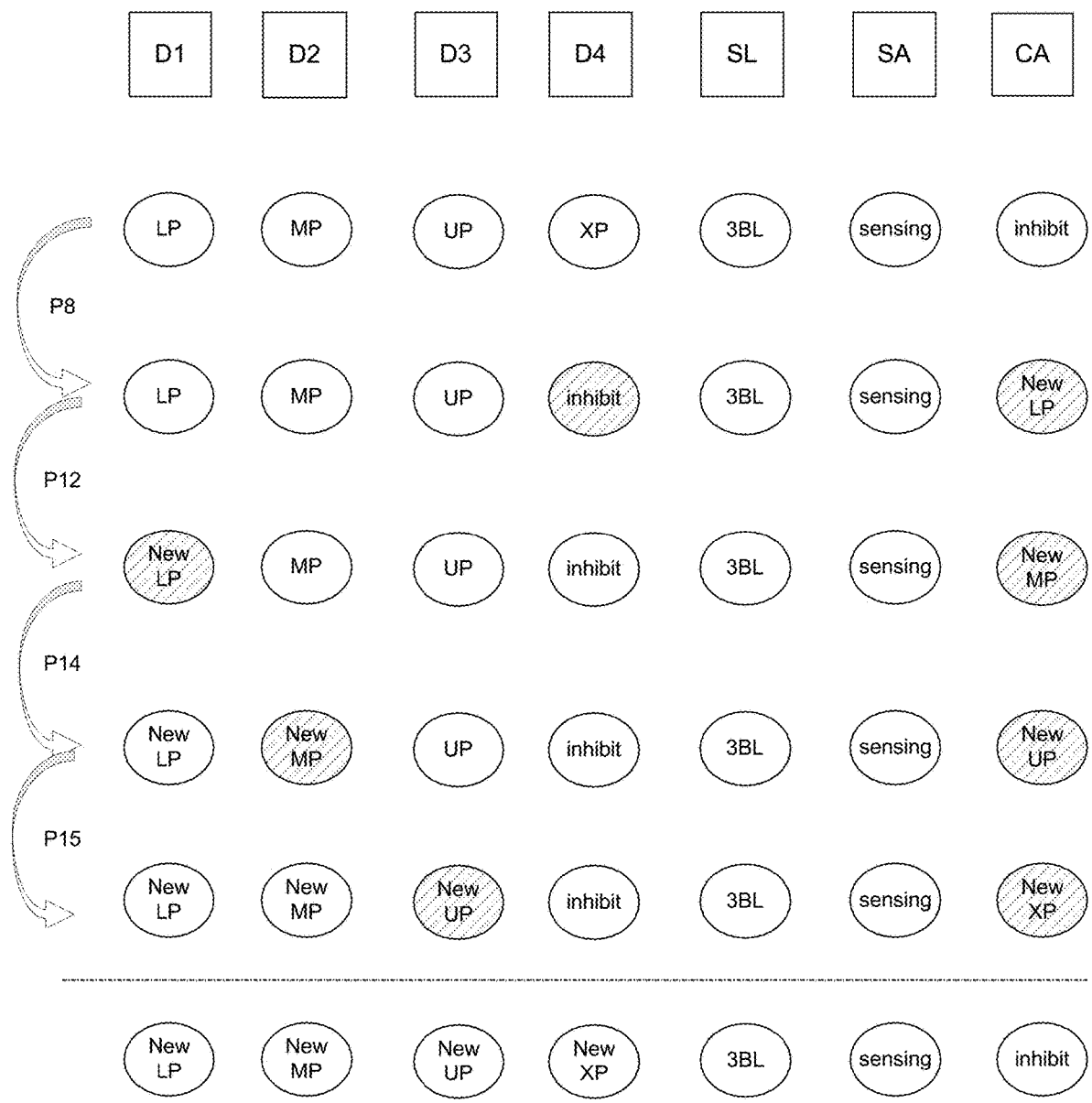

FIG. 16B shows cache programming for a NAND memory device in the QLC mode (i.e., 4-bit memory cell with 16 logic states), according to some embodiments of the present disclosure. After state P8 pass verification, i.e., after states P1, P2, . . . , P8 all have been successfully programmed, latch D4 can be vacated and top page (XP) of current programming data stored in latch D4 can be discarded. The inhibit information can be transferred from the cache latch CA to the latch D4 and a new lower page can be uploaded to the cache latch CA.

Next, data stored in latches D1, D2, D3 and inhibit information stored in latch D4 latch can be used to continue and complete the programming of higher states P9-P15. For example, when the inhibit information in latch D4 is "0" indicating further programming of higher states, states P9 to P15 can be programmed, for example, according to the mapping scheme in FIG. 4D based on lower page, middle page and upper page in respective latches D1, D2 and D3. When latches D1, D2, D3 store bits 1/1/1, respectively, corresponding memory cell can be programmed to state P9. Similarly, when bits stored in latches D1/D2/D3 are 0/0/1, corresponding memory cell can be programmed to state P10. Likewise, D1/D2/D3=0/1/0 corresponds to state P11; D1/D2/D3=1/0/0 corresponds to P12; D1/D2/D3=0/1/1 corresponds to P13; D1/D2/D3=1/0/1 corresponds to P14; and D1/D2/D3=1/1/0 corresponds to P15. Once a corresponding memory cell passes verification of programming a target state, the D4 latch of the memory cell can be changed to, for example, "1" to inhibit the memory cell for additional programming pulses.

If programming fails after the top page of current programming data stored in the latch D4 have been discarded, i.e., after states P1, P2, P3, . . . , P8 have been successfully programmed, the discarded top page previously stored in latch D4 can be recovered by using a read reference voltage $V_{R8}$, where the SLC read can be performed to separate two groups of logic states using a single read reference voltage (e.g., the read reference voltage $V_{R8}$). FIG. 18 illustrates a recovering method for the top page after states P1-P8 have passed programming verification and the top page of the current programming data has been discarded from latch D4, according to some embodiments of the present disclosure. The read reference voltage $V_{R8}$ can be used to separate the 16 states of the QLC mode into two distinct groups, where the first group of states ER, P1, . . . , P7 have threshold voltages $V_{th}$ lower than the read reference voltage $V_{R8}$ and the second group of states P8, P9, . . . , P15 have threshold voltages $V_{th}$ higher than the read reference voltage $V_{R8}$. A bit of "1" can be constructed for the first group having states ER and P1-P7, and a bit of "0" can be constructed for the second group having states P8-P15, shown as the SLC read in FIG. 18. Based on the mapping scheme in FIG. 4D, each state within the first group and each state within the second group can be determined and distinguished solely based on the data in the lower page, the middle page and the upper page stored in respective latches D1, D2 and D3. For example, in the first group of states ER and P1-P7, the lower page/middle page/upper page are 1/1/1, 0/0/0, 0/0/1, 0/1/0, 1/0/0, 0/1/1, 1/1/0, 1/0/1, respectively. In the second group of states P8-P15, the lower page/middle page/upper page are 0/0/0, 1/1/1, 0/0/1, 0/1/0, 1/0/0, 0/1/1, 1/0/1, 1/1/0, respectively. Therefore, the top page for states ER and P1-P15 can be determined and recovered according to the pre-determined mapping scheme in FIG. 4D.

Referring back to FIG. 16B, after state P12 passes verification, i.e., after states P1, P2, . . . , P12 all have been successfully programmed, the lower page can be discarded from latch D1. The new lower page can be transferred from the cache latch CA to the latch D1. A new middle page of the new programming data can be uploaded to the cache latch CA.

Figure 19:
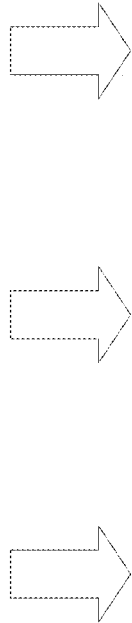

If programming fails after the lower page and the top page previously stored in latches D1 and D4 have been discarded after states P1, P2, . . . , P12 have been successfully programmed and before state P14 passes verification, the lower page and the top page of current programming data can be recovered by using read reference voltages $V_{R4}$, $V_{R8}$ and $V_{R12}$. FIG. 19 illustrates a recovering method for the lower page and top page after states P1-P12 have passed programming verification, according to some embodiments of the present disclosure. The read reference voltages $V_{R4}$, $V_{R8}$ and $V_{R12}$ can separate the 16 states into 4 sub-groups: a first sub-group of states ER and P1-P3, a second sub-group of states P4-P7, a third sub-group of states P8-P11 and a fourth sub-group of states P12-P15. Because threshold voltages are lower than the read reference voltage $V_{R4}$, the first sub-group of states ER and P1-P3 can be separated from other states. Each state within the first sub-group can then be determined solely based on the middle page and the upper page stored in latches D2 and D3. For example, states ER and P1-P3 have binary code 1/1, 0/0, 0/1 and 1/0 in latches D2/D3 (middle page/upper page), respectively, according to the mapping scheme in FIG. 4D. Therefore, the first sub-group of states ER and P1-P3 can recover the lower page/top page according to the mapping scheme in FIG. 4D, i.e., 1/1, 0/0/, 0/0/ and 0/0, respectively. Because the second sub-group of states P4, P5, P6, and P7 have threshold voltages lower than the read reference voltage $V_{R8}$ and higher than the read reference voltage $V_{R4}$, the second sub-group can be separated from other states. Likewise, each state within the second sub-group can then be determined solely based on the middle page and the upper page stored in latches D2 and D3. For example, the second sub-group of states P4-P7 have binary code 0/0, 1/1, 1/0, and 0/1 in latches D2/D3, respectively, according to the mapping scheme in FIG. 4D. Therefore, states P4-P7 can recover the lower page/top page according to the mapping scheme in FIG. 4D, i.e., 1/0, 0/0, 1/0, and 1/0, respectively. By using the read reference voltage $V_{R12}$, the third sub-group of states P8-P11 can be separated from other states because the threshold voltages of the third sub-group are lower than the read reference voltage $V_{R12}$ and higher than the read reference voltage $V_{R8}$. Similarly, because each state within the third sub-group has a unique binary code in latches D2/D3 (middle page/upper page), according to the mapping scheme in FIG. 4D, the lower page/top page of the third sub-group of states P8-P11 can also be recovered, i.e., 0/1, 1/0, 0/1 and 0/1, respectively. The remaining states in the fourth sub-group of states P12-P15 can be recovered similarly as discussed above, i.e., 1/1, 0/1, 1/1, and 1/1 for lower page/top page, respectively.

Referring back to FIG. 16B, after state P14 passes verification, i.e., after states P1-P14 all have been successfully programmed, the middle page stored in latch D2 can be discarded. The new middle page can be transferred from the cache latch CA to latch D2. Then, a new upper page of new programming data can be uploaded to the cache latch CA. The remaining state P15 can be programmed according to the inhibit information stored in latch D4 and the upper page stored in latch D3.

Figure 20:

FIG. 20 illustrates a recovering method after the lower page, the middle page and the top page have been discarded after successfully programming states P1 through P14 in QLC mode (where n=4), according to some embodiments of the present disclosure. Read reference voltages $V_{R2}$, $V_{R4}, \ldots, V_{R14}$ can be used to separate the 16 states into 8 pair-groups by comparing threshold voltages of each state and the read reference voltages. A first pair-group includes states ER and P1, having threshold voltages $V_{th}$ less than the read reference voltage $V_{R2}$. A second pair-group includes states P2 and P3, having threshold voltages $V_{th}$ less than the read reference voltage $V_{R4}$ but higher than the read reference voltage $V_{R2}$. A third pair-group includes states P4 and P5, having threshold voltages Vth less than the read reference voltage $V_{R6}$ but higher than the read reference voltage $V_{R4}$. A fourth pair-group includes states P6 and P7, having threshold voltages Vth less than the read reference voltage $V_{R8}$ but higher than the read reference voltage $V_{R6}$. A fifth pair-group includes states P8 and P9, having threshold voltages Vth less than the read reference voltage $V_{R10}$ but higher than the read reference voltage $V_{R8}$. A sixth pair-group includes states P10 and P11, having threshold voltages Vth less than the read reference voltage $V_{R12}$ but higher than the read reference voltage $V_{R10}$. A seventh pair-group includes states P12 and P13 having threshold voltages Vth less than the read reference voltage $V_{R14}$ but higher than the read reference voltage $V_{R12}$. An eighth pair-group includes states P14 and P15. Within a pair-group, each state can be identified through the upper page stored in latch D3. For example, within the first pair-group, the upper pages for states EP and P1 are "1" and "0," respectively. Therefore, according to the mapping scheme in FIG. 4D, the lower page/middle page/top page originally stored in latches D1/D2/D4 can be recovered as 1/1/1 and 0/0/0 for states EP and P1, respectively. Similarly, for the second pair-group, the upper pages for states P2 and P3 are "1" and "0," respectively. According to the mapping scheme in FIG. 4D, the lower page/middle page/top page originally stored in latches D1/D2/D4 can be recovered as 0/0/0 and 0/1/0 for states P2 and P3, respectively. Likewise, for the third pair-group, the lower page/middle page/top page originally stored in latches D1/D2/D4 can be recovered as 1/0/0 and 0/1/0 for states P4 and P5, respectively. For the fourth pair-group, the lower page/middle page/top page originally stored in latches D1/D2/D4 can be recovered as 1/1/0 and 1/0/0 for states P6 and P7, respectively. For the fifth pair-group, the lower page/middle page/top page originally stored in latches D1/D2/D4 can be recovered as 0/0/1 and 1/1/0 for states P8 and P9, respectively. For the sixth pair-group, the lower page/middle page/top page originally stored in latches D1/D2/D4 can be recovered as 0/0/1 and 0/1/1 for states P10 and P11, respectively. For the seventh pair-group, the lower page/middle page/top page originally stored in latches D1/D2/D4 can be recovered as 1/0/1 and 0/1/1 for states P12 and P13, respectively. For the eighth pair-group, the lower page/middle page/top page originally stored in latches D1/D2/D4 can be recovered as 1/0/1 and 1/1/1 for states P14 and P15, respectively.

Referring back to FIG. 16B, the upper page stored in latch D3 can be discarded after states P1-P15 have all passed programming and verification. The new upper page can be transferred from the cache latch CA to the latch D3 and a new top page (i.e., new XP) of new programming data can be uploaded to the cache latch. Time used for uploading of the new top page can be hidden within programming discharge and epilogue time. In some embodiments, 3BL information stored in latch SL can also be discarded after states P1-P14 are programmed successfully because programming of state P15 does not need to use the 3BL information.

Figure 17:
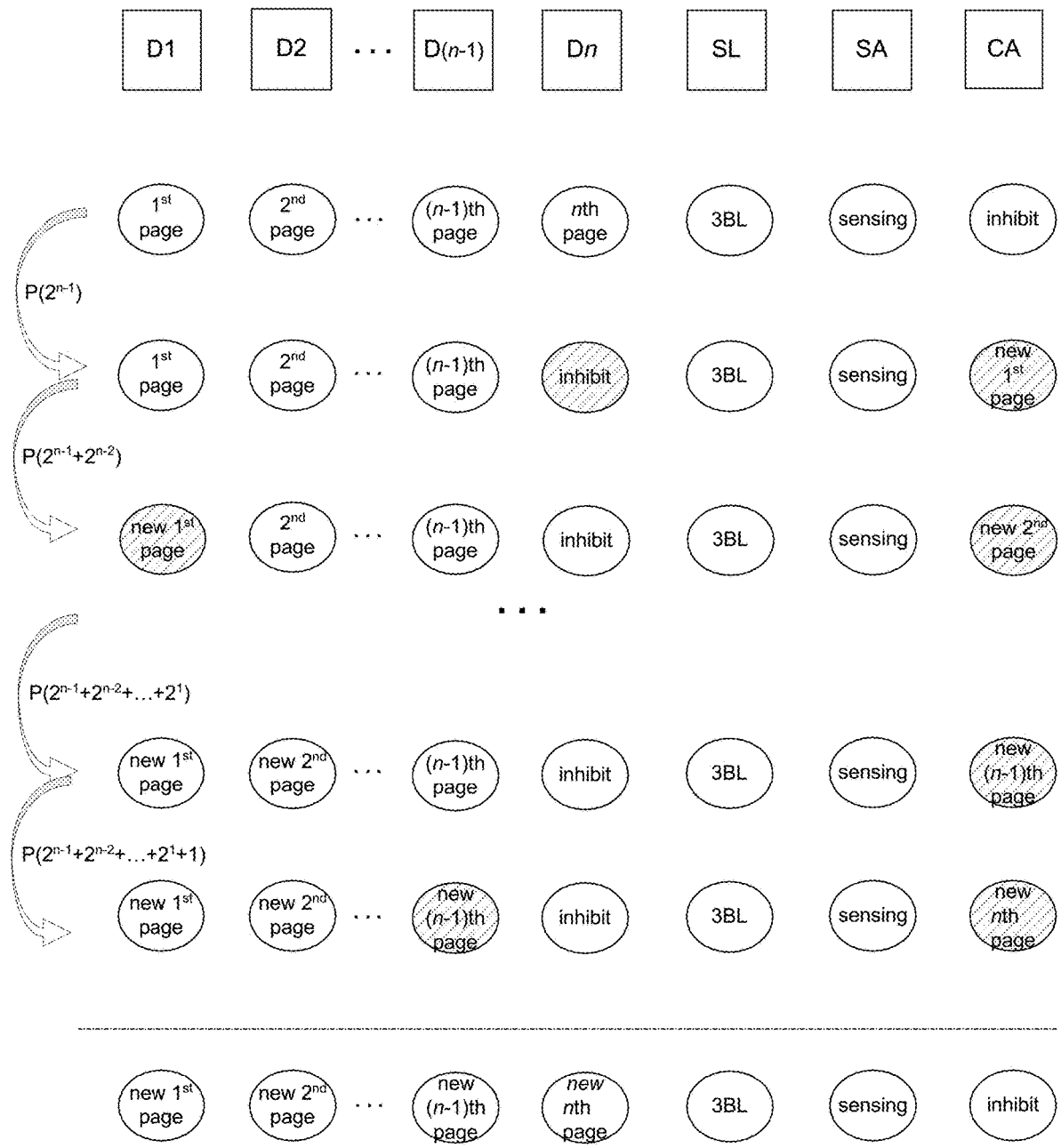

The cache programming schemes disclosed above are not limited to the TLC mode or QLC mode and can be implemented to xLC mode for n-bit memory cell having $2^n$ states. FIG. 17 illustrates an exemplary cache programming scheme for the xLC mode, according to some embodiments of the present disclosure. As described previously, programming data of $1^{st}$, $2^{nd}$, ..., nth bit can be stored in latches D1, D2, ..., Dn for the n-bit memory cell to be programmed. When programming a plurality of memory cells in a memory page, programming data of corresponding $1^{st}$, $2^{nd}$ ..., nth logic page can be stored in respective set of latches D1, D2, ..., Dn. For simplicity, cache programming in one page buffer for a n-bit memory cell is described below as an example. As described above, in each page buffer, the latches SL, SA and CA can be loaded with 3BL, sensing and inhibit information, respectively.

Starting from state ER, after successfully programming states P1, P2, P3, ..., $P(2^{n-1})$ latch Dn that stores an nth logic page of the current programming data can be vacated. The inhibit information stored in the cache latch CA can be transferred to the latch Dn. Next, a $1^{st}$ logic page of new programming data (i.e., a new $1^{st}$ logic page) can be uploaded to the cache latch CA.

Next, the remaining states $P(2^{n-1}+1)$ to $P(2^n-1)$ can be programmed based on the current programming data stored in latches D1, D2, ..., Dn−1 together with the inhibit information provided by the latch Dn. If the inhibit information is, for example, "1" indicating inhibit further programming, corresponding bit line (BL) of the memory cell will be applied with an inhibit voltage to avoid further programming the memory cell. If the inhibit information is, for example, "0" indicating further programming is needed, higher states can be programmed from $P(2^{n-1}+1)$ to $P(2^n-1)$ and target-only-verification (TOV) can be performed based on data stored in latches D1, D2, ..., and Dn−1. During TOV, only a state matching a target state (or program level) is considered passing programming. A higher state (i.e., a state with higher threshold voltage) is not considered as passing programming for the target state. For example, when state P4 is the target state, a memory cell at state P5 or higher is not considered passing verification.

If programming fails after the nth logic page of current programming data stored in the latch Dn have been discarded, i.e., after states P1, P2, P3, ..., $P(2^{n-1})$ have been successfully programmed, the nth logic page of current programming data can be recovered by using a SLC read, for example, using a read reference voltage $V_{R2}^{n-1}$, where the read reference voltage $V_{R2}^{n-1}$ is higher than threshold voltage $V_{th}$ of state $P(2^{n-1}-1)$, but lower than threshold voltage Vth of state $P(2^{n-1})$. In the other words, states ER, P1, P2, ..., $P(2^{n-1}-1)$ have threshold voltages $V_{th}$ lower than the read reference voltage $V_{R2}^{n-1}$ and the states $P(2^{n-1}-1)$, $P(2^{n-1}+1)$, ..., $P(2^n-1)$ have threshold voltages $V_{th}$ higher than the read reference voltage $V_{R2}^{n-1}$ Therefore, the $2^n$ states can be separated into two distinct groups (i.e., a first group and a second group) each having $2^{n-1}$ states, by, for example, sensing current at the corresponding bit line. In some embodiments, a constructed single bit (i.e., through the SLC read) can be used to represent these two distinct groups. For example, a bit of "1" can be constructed for the first group having the states ER, P1, P2, . . . , P($2^{n-1}$−1) and a bit of "0" can be constructed for the second group having the states P($2^{n-1}$), P($2^{n-1}$+1), . . . , P($2^n$−1). As discussed previously, a mapping scheme can be selected to represent the $2^n$ states of the n-bit memory cell in xLC mode using pre-processed binary codes. In some embodiments, the pre-processed binary codes from the $1^{st}$, $2^{nd}$, . . . , (n−1)th logic pages can distinctly represent each state within the first group and each state within the second group. Therefore, the nth logic page in the first group and the second group can be recovered based on the $1^{st}$, $2^{nd}$, . . . , (n−1)th logic pages according to the mapping scheme.

The cache programming also includes releasing the latch D1 by discarding the $1^{st}$ logic page after state P($2^{n-1}$+$2^{n-2}$) passes verification, i.e., after state P1 through state P($2^{n-1}$++$2^{n-2}$) all have been successfully programmed. The new $1^{st}$ logic page of the new programming data can be transferred from cache latch CA to latch D1. A $2^{nd}$ logic page of the new programming data (i.e., a new $2^{nd}$ logic page) can be uploaded to cache latch CA. Programming of remaining states can continue based on remaining data (i.e., the $2^{nd}$, $3^{rd}$, . . . , (n−1)th logic pages) stored in latches D2, D3, . . . , Dn−1 as well as the inhibit information stored in latch Dn.

If programming fails after the $1^{st}$ logic page and nth logic page have been discarded from latch D1 and Dn, respectively, i.e., after states P1 through P($2^{n-1}$+$2^{n-2}$) have been successfully programmed, but before state P($2^{n-1}$+$2^{n-2}$+$2^{n-3}$) have been successfully programmed, the $1^{st}$ logic page and the nth logic page previously discarded can be recovered based on $2^{nd}$, $3^{rd}$, . . . , (n−1)th logic pages by implementing the read reference voltages $V_{R2}^{n-2}$, $V_{R2}^{n-1}$, and $V_{R(2^{n-1}+2^{n-2})}$. By using the read reference voltages $V_{R2}^{n-2}$, a first sub-group of states ER, P1, . . . , P($2^{n-2}$−1) that have threshold voltages lower than the read reference voltage $V_{R2}^{n-2}$ can be separated from the other states and can be determined solely based on the $2^{nd}$, $3^{rd}$, . . . , (n−1)th logic pages according to the mapping scheme implemented. Similarly, by using the read reference voltage $V_{R2}^{n-1}$, a second sub-group of states P($2^{n-2}$), P($2^{n-2}$+1), . . . , P($2^{n-1}$−1) that have threshold voltages lower than the read reference voltage $V_{R2}^{n-1}$ but higher than the read reference voltage $V_{R2}^{n-2}$ can be separated from other states and can be determined solely based on the $2^{nd}$, $3^{rd}$, . . . , (n−1)th logic pages according to the mapping scheme implemented. Lastly, by using the read reference voltage $V_{R(2^{n-1}+2^{n-2})}$, a third sub-group of states P($2^{n-1}$), P($2^{n-1}$+1), . . . , P($2^{n-1}$+$2^{n-2}$−1) and a fourth sub-group of states P($2^{n-1}$+$2^{n-2}$), P($2^{n-1}$+$2^{n-2}$+1), P($2^n$−1) can be separated because the third sub-group of states have threshold voltages lower than the read reference voltage $V_{R(2^{n-1}+2^{n-2})}$. The third and the fourth sub-groups of states can also be determined solely based on the $2^{nd}$, $3^{rd}$, . . . , (n−1)th logic pages according to the mapping scheme implemented.

The cache programming further includes releasing the latch D2, i.e., discarding the $2^{nd}$ logic page stored in latch D2, after states P1 through P($2^{n-1}$+$2^{n-2}$+$2^{n-3}$) have been successfully programmed (not shown in FIG. 17). The new $2^{nd}$ logic page can then be transferred from the cache latch CA to the latch D2. A $3^{rd}$ logic page of new programming data (i.e., a new $3^{rd}$ logic page) can be uploaded to the cache latch CA. The remaining states P($2^{n-1}$+$2^{n-2}$+$2^{n-3}$+1) through P($2^n$−1) can be programmed according to the inhibit information stored in latch Dn as well as remaining logic pages stored in latches D3, D4, . . . , Dn−1. If programming fails after the $2^{nd}$ logic page stored in latch D2 has been discarded, the $2^{nd}$ logic page as well as previously discarded $1^{st}$ logic page and the nth logic page of the current programming data can be recovered based on remaining logic pages by using read reference voltages $V_{R2}^{n-3}$, $V_{R2}^{n-2}$, $V_{R2}^{n-3}$+$V_{R2}^{n-2}$, $V_{R2}^{n-1}$, $V_{R(2^{n-1}+2^{n-3})}$, $V_{R(2^{n-1}+2^{n-2})}$, and $V_{R(2^{n-1}+2^{n-2}+2^{n-3})}$, which can separate the $2^n$ states into 8 distinct groups. States within each group can be identified and determined based on the mapping scheme implemented. Similar scheme can be continued for higher states, e.g., after states P1, P2, . . . , P($2^{n-1}$+$2^{n-2}$+$2^{n-3}$+$2^{n-4}$) have been successfully programmed. And so on.

When state P($2^{n-1}$+$2^{n-2}$+ . . . +$2^1$) or state P($2^n$−2) passes verification, i.e., when states P1, P2, P3, . . . , P($2^n$−2) all have been successfully programmed, the (n−2)th logic page of current programming data stored in latch D(n−2) can be discarded. A new (n−2)th logic page previously uploaded to the cache latch CA can be transferred to the latch D(n−2). A new (n−1)th logic page of the new programming data can be uploaded to the cache latch CA. If programming fails after $1^{st}$, $2^{nd}$, . . . , (n−2)th, and nth logic pages have been discarded, i.e., after states P1, P2, P3, . . . , P($2^n$−2) all have been successfully programmed, the $1^{st}$, $2^{nd}$, . . . , (n−2)th, and nth logic pages can be recovered by using read reference voltages $V_{R2}$, $V_{R4}$, . . . , $V_{R(2^n-2)}$. By comparing threshold voltages of states ER and P1-P($2^n$−2) with the read reference voltages $V_{R2}$, $V_{R4}$, . . . , $V_{R(2^n-2)}$, the $2^n$ states can be separated into pair-groups. Each pair-group includes two states that have distinct binary codes according to the remaining logic page (i.e., the (n−1)th logic page). Therefore, the $1^{st}$, $2^{nd}$, . . . , (n−2)th, and nth logic pages can be recovered for each pair-group based on the predetermined mapping scheme.

After states P1 through P($2^{n-1}$+$2^{n-2}$+ . . . +$2^1$+1), i.e., P1, P2, . . . , and P($2^n$−1) all have been successfully programmed, the (n−1)th logic page stored in the latch D(n−1) can be discarded and latch D(n−1) can be vacated. The new (n−1)th logic page can be transferred from the cache latch CA to the latch D(n−1) and a new nth logic page of the new programming data can be uploaded to the cache latch CA. Time used for uploading of the new nth logic page can be hidden within programming discharge and epilogue time. Namely, uploading the new nth logic page can be performed during programming discharge and epilogue. In some embodiments, the 3BL information stored in the latch SL can also be discarded after states P1 through P($2^n$−2) have been successfully programmed because programming of the state P($2^n$−1) does not need the 3BL information.

The next cycle of programming can start with latches D1, D2, . . . , and Dn storing the new $1^{st}$, $2^{nd}$ . . . , (n−1)th, and nth logic pages of the new programming data and latches SL, SA and CA storing the 3BL information, sensing information and the inhibit information.

To program a 3D NAND memory (e.g., the NAND flash memory 100 in FIG. 1A), command sequences can be sent from a host (e.g., the host computer 15) to the 3D NAND memory through a memory controller (e.g., the memory controller 20). To implement the cache programming described above, control circuit (e.g., the control circuit 70 in FIG. 2A) of the 3D NAND memory can issue new commands to the page buffer/sense amplifier 50. For example, a page buffer fast release (PBFR) command with row address cycles can be generated to reconstruct data previously discarded and read out data successfully programmed to the memory cells.

For example, for the n-bit memory cell in the xLC mode, when programming fails before state P($2^{n-1}$) passes verification, the control circuit can send the PBFR command to read out current n logic pages from the latches D1, D2, . . . , Dn directly because none of the current n logic pages have been discarded before the state $P(2^{n-1})$ has been programed successfully. The programming failure signal, for example, an (n−1)-bit status code can be used to represent programming fail status. In the example of the TLC mode where n=3, a programming fail before state P4 passes verification can be represented by the 2-bit status code (11) and the PBFR command can be used to read out the current three logic pages (lower page, middle page and upper page) stored in the latches D1, D2 and D3 directly. In the example of the QLC mode where n=4, a programming fail before state P8 passes verification can be represented by a 3-bit status code, e.g., (111) and the PBFR command can be used to read out the current four logic pages (lower page, middle page, upper page and top page) stored in the latches D1, D2, D3 and D4 directly.

When programming fails after states P1, P2, . . . , $P(2^{n-1})$ pass verification but before state $P(2^{n-1}+2^{n-2})$ passes verification, the PBFR command can be used to read out the new $1^{st}$ logic page stored in cache latch CA. Next, a reconstruct command can be used to reconstruct the current n logic pages. Then, the PBFR command can be used to read out the reconstructed current n logic pages. In the example of the TLC mode where n=3, the 2-bit status code (10) can represent a programming fail after states P1, P2, P3 and P4 pass verification and before state P6 passes verification. First, the PBFR command can be used to read out the new lower page stored in the cache latch CA (see FIG. 16A). Next, the reconstruct command can be used to reconstruct the current three logic pages (as described with respect to FIGS. 8 and 10). Then, the PBFR command can be used to read out the reconstructed current three logic pages (lower page, middle page and upper page). In the example of the QLC mode where n=4, a programming fail after states P1, P2, . . . , P8 pass verification and before state P12 passes verification can be represented by the 3-bit status code, e.g., (110). First, the PBFR command can be used to read out the new lower page stored in the cache latch CA (see FIG. 16B). Next, the reconstruct command can be used to reconstruct the current four logic pages (as described with respect to FIG. 18). Then, the PBFR command can be used to read out the reconstructed current four logic pages (lower page, middle page, upper page and top page).

When programming fails after states P1, P2, . . . , $P(2^{n-1}+2^{n-2})$ pass verification but before state $P(2^{n-1}+2^{n-2}+2^{n-3})$ passes verification, the PBFR command can be used to read out the new $1^{st}$ and $2^{nd}$ logic pages stored in latch D1 and the cache latch CA, respectively. Next, a reconstruct command can be used to reconstruct the current n logic pages. Then, the PBFR command can be used to read out the reconstructed current n logic pages. In the example of the QLC mode where n=4, a programming fail after states P1, P2, . . . , P12 pass verification and before state P14 passes verification can be represented by the 3-bit status code, e.g., (101). First, the PBFR command can be used to read out the new lower page and the new middle page stored in the latch D1 and the cache latch CA, respectively (see FIG. 16B). Next, the reconstruct command can be used to reconstruct the current four logic pages (as described with respect to FIG. 19). Then, the PBFR command can be used to read out the reconstructed current four logic pages (lower page, middle page, upper page and top page).

Similar commands can be used to recover data for programming fails after states P1, P2, . . . , $P(2^{n-1}+2^{n-2}+2^{n-3})$ pass verification and before state $P(2^{n-1}+2^{n-2}+2^{n-3}+2^{n-4})$ passes verification. And so on.

When programming fails after states P1, P2, . . . , $P(2^{n}-2)$ pass verification but before state $P(2^{n-1})$ passes verification, the PBFR command can be used to read out the new $1^{st}$ logic page, new $2^{nd}$ logic page, . . . , new (n−1)th logic page stored in latch D1, D2, . . . , Dn-2 and the cache latch CA, respectively. Next, a reconstruct command can be used to reconstruct the current n logic pages. Then, the PBFR command can be used to read out the reconstructed current n logic pages. In the example of the TLC mode where n=3, the 2-bit status code (01) can represent a programming fail after states P1, P2, . . . , P6 pass verification and before state P7 passes verification. First, the PBFR command can be used to read out the new lower page and new middle page stored in the latch D1 and cache latch CA, respectively (see FIG. 16A). Next, the reconstruct command can be used to reconstruct the current three logic pages (as described with respect to FIG. 12). Then, the PBFR command can be used to read out the reconstructed current three logic pages (lower page, middle page and upper page). In the example of the QLC mode where n=4, a programming fail after states P1, P2, . . . , P14 pass verification and before state P15 passes verification can be represented by the 3-bit status code, e.g., (011). First, the PBFR command can be used to read out the new lower page, the new middle page and the new upper page stored in the latch D1, D2 and the cache latch CA, respectively (see FIG. 16B). Next, the reconstruct command can be used to reconstruct the current four logic pages (as described with respect to FIG. 20). Then, the PBFR command can be used to read out the reconstructed current four logic pages (lower page, middle page, upper page and top page).

After states P1, P2, . . . , $P(2^{n}-1)$ all have been programmed successfully, a normal read command can be used to read out the n logic pages from programmed memory cells.

In summary, the present disclosure provides a method of cache programming of a NAND flash memory. The method includes discarding a first logic page of first programming data from a first set of data latches in a plurality of page buffers of the NAND flash memory when a first group of logic states are programmed and verified for a plurality of memory cells in a memory page of the NAND flash memory. Each of the plurality of memory cells comprises $2^n$ logic states. Each of the plurality of memory cells is coupled to at least one of the plurality of page buffers. The plurality of page buffers comprises n set of data latches configured to store n logic pages of programming data. The method also includes uploading a second logic page of second programming data to a set of cache latches in the plurality of page buffers.

The present disclosure also provides a method of cache programming of a NAND flash memory in a triple-level-cell (TLC) mode. The method includes discarding an upper page of a first programming data from a first set of data latches in a plurality of page buffers of the NAND flash memory when a first group of logic states are programmed and verified for a plurality of memory cells in a memory page of the NAND flash memory. Each of the plurality of memory cells has 8 logic states. The 8 logic states can be an erased state and ith logic states, wherein i=1 to 7 and threshold voltages of the 8 logic states are in an ascending order. Each of the plurality of memory cells is coupled to at least one of the plurality of page buffers. The plurality of page buffers comprises the first set of data latches, a second set of data latches and a third set of data latches, configured to store the upper page, a middle page and a lower page of programming data, respectively. The method further includes uploading a lower page of second programming data to a set of cache latches in the plurality of page buffers.

The present disclosure further provides a memory device. The memory device includes memory cells arranged in rows and columns, each memory cell configured to store n-bit of data, wherein n is a whole number larger than 1. The memory device also includes a periphery circuit coupled to the memory cells and configured to program a selected row of memory cells according to n logic pages of current programming data. The periphery circuit includes page buffers, each page buffer having n data latches and coupled to a column of memory cells through a bit line. The periphery circuit is further configured to store the n logic pages of the current programming data in the n data latches for programming the selected row of memory cells; release one or more of the n data latches, by discarding one or more of the n logic pages of the current programming data correspondingly, before the programming the selected row of memory cells according to the n logic pages of the current programming data is completed; store one or more of n logic pages of new programming data in the released data latches before the programming the selected row of memory cells according to the n logic pages of the current programming data is completed; and recover the discarded one or more of the n logic pages of the current programing data when there is a programming failure, based on remaining logic pages of the current programming data, logic states of the selected row of memory cells that have passed programming verification and a mapping scheme between a set of n-bit binary codes and $2^n$ logic states of each memory cell.

In some embodiments, each page buffer further comprises a cache latch configured to store, sequentially, an inhibit information and each of the one or more of the n logic pages of the new programming data before the programming the selected row of memory cells according to the n logic pages of the current programming data is completed.

In some embodiments, each page buffer further comprises a non-data latch configured to store a 3-bit-line (3BL) information to facilitate the programming the selected row of memory cells by providing three voltage levels to a respective bit line.

In some embodiments, each page buffer further comprises a non-data latch configured to store a sensing information indicating whether an operation is a read operation or a programming operation.

In some embodiments, each memory cell comprises $2^n$ logic states: an erase state (state ER), a $1^{st}$ logic state (state P1), . . . , an $(2^n-1)$th logic state (state $P(2^n-1)$), with threshold voltages in an ascending order.

In some embodiments, the peripheral circuit is further configured to recover the discarded one or more of the n logic pages of the current programming data when there is a programming failure, wherein the recovery is based on remaining logic pages of the current programming data, the logic states of the selected row of memory cells that have passed programming verification and a mapping scheme between a set of n-bit binary codes and the $2^n$ logic states of the memory cell.

In some embodiments, the peripheral circuit is further configured to discard an nth logic page of the current programming data after states P1, P2, . . . , $P(2^{n-1})$ of the selected row of memory cells have passed programming verification.

In some embodiments, the peripheral circuit is further configured to recover the discarded nth logic page of the current programming data by separating the $2^n$ logic states into two groups using a read reference voltage $V_{R2}^{n-1}$. The read reference voltage $V_{R2}^{n-1}$ is higher than a threshold voltage of state $P(2^{n-1}-1)$, but lower than a threshold voltage of state $P(2^{n-1})$. The logic states in each group are distinct based on remaining logic pages of the current programming data and the mapping scheme.

In some embodiments, the peripheral circuit is further configured to discard a $1^{st}$ logic page of the current programming data after states P1, P2, . . . , $P(2^{n-1}+2^{n-2})$ of the selected row of memory cells have passed programming verification.

In some embodiments, the peripheral circuit is further configured to recover the discarded $1^{st}$ and nth logic pages of the current programming data by separating the $2^n$ logic states into four groups using read reference voltages $V_{R2}^{n-2}$, $V_{R2}^{n-1}$ and $V_{R(2^{n-1}+2^{n-2})}$. The read reference voltage $V_{RM}$ is higher than a threshold voltage of state $P(M-1)$, but lower than a threshold voltage of state $P(M)$, $M=2^{n-1}$, $2^{n-2}$, and $2^{n-1}+2^{n-2}$. The logic states in each group are distinct based on remaining logic pages of the current programming data and the mapping scheme.

In some embodiments, the peripheral circuit is further configured to discard an (n−2)th logic page of the current programming data after states P1, P2, . . . , $P(2^n-2)$ of the selected row of memory cells have passed programming verification.

In some embodiments, the peripheral circuit is further configured to recover the discarded $1^{st}$, . . . , (n−2)th, and nth logic pages of the current programming data by separating the $2^n$ logic states into pair-groups using read reference voltages $V_{R2}$, $V_{R4}$, . . . , $V_{R(2^n-2)}$. The read reference voltage $V_{RL}$ is higher than a threshold voltage of state $P(L-1)$, but lower than a threshold voltage of state $P(L)$, wherein $L=2, 4, . . . , 2^n-2$. Each pair-group comprises two distinct logic states based on a remaining (n−1)th logic page of the current programming data and the mapping scheme.

In some embodiments, the peripheral circuit is further configured to discard an (n−1)th logic page of the current programming data after states P1, P2, . . . , $P(2^{n-1})$ of the selected row of memory cells have passed programming verification.

In some embodiments, the peripheral circuit is further configured to store at least one logic page of the current programming data before the programming the selected row of memory cells according to the n logic pages of the current programming data is completed.

The present disclosure also provides a method of cache programming for a memory device, wherein the memory device comprises memory cells arranged in rows and columns. The method includes storing n logic pages of current programming data in page buffers, wherein n is a whole number greater than 1; each page buffer comprises n data latches to store n-bit of data; and each page buffer is coupled with a column of memory cells. The method also includes programming a selected row of memory cells according to the n logic pages of current programming data; and discarding one or more of the n logic pages of the current programming data before the programming the selected row of memory cells according to the n logic pages of the current programming data is completed. The method further includes storing one or more of n logic pages of new programming data before the programming the selected row of memory cells according to the n logic pages of the current programming data is completed.

In some embodiments, the method further includes, after discarding the one or more of the n logic pages of current programming data, programming the selected row of memory cells based on remaining logic pages of current programming data.

In some embodiments, the method further includes recovering the discarded one or more of the n logic pages of the current programming data when there is a programming failure. In some embodiments, the recovering comprises reconstructing the discarded one or more of the n logic pages of the current programming data based on remaining logic pages of the current programming data, logic states of the selected row of memory cells that have passed programming verification and a mapping scheme between a set of n-bit binary codes and the logic states of the memory cell.

In some embodiments, the programming the selected row of memory cells comprises programming each memory cell to one of $2^n$ logic states to store an n-bit of data: an erase state (state ER), a $1^{st}$ logic state (state P1), ..., an $(2^n-1)$th logic state (state $P(2^n-1)$), with threshold voltages in an ascending order.

In some embodiments, the method further includes discarding an nth logic page of the current programming data after states P1, P2, ..., $P(2^{n-1})$ of the selected row of memory cells have passed programming verification.

In some embodiments, the method further includes recovering the discarded nth logic page of the current programming data by separating the $2^n$ logic states into two groups using a read reference voltage $V_{R2}{}^{n-1}$, wherein the read reference voltage $V_{R2}{}^{n-1}$ is higher than a threshold voltage of state $P(2^{n-1}-1)$, but lower than a threshold voltage of state $P(2^{n-1})$; and the logic states in each group are distinct based on remaining logic pages of the current programming data and the mapping scheme.

In some embodiments, the method further includes discarding a st logic page of the current programming data after states P1, P2, ..., $P(2^{n-1}+2^{n-2})$ of the selected row of memory cells have passed programming verification.

In some embodiments, the method further includes recovering the discarded $1^{st}$ and nth logic pages of the current programming data by separating the $2^n$ logic states into four groups using read reference voltages $V_{R2}{}^{n-2}$, $V_{R2}{}^{n-1}$ and $V_{R(2^{n-1}+2^{n-2})}$. The read reference voltage $V_{RM}$ is higher than a threshold voltage of state $P(M-1)$, but lower than a threshold voltage of state $P(M)$, $M=2^{n-1}$, $2^{n-2}$, and $2^{n-1}+2^{n-2}$. The logic states in each group are distinct based on remaining logic pages of the current programming data and the mapping scheme.

In some embodiments, the method further includes discarding an (n–2)th logic page of the current programming data after states P1, P2, ..., $P(2^n-2)$ of the selected row of memory cells have passed programming verification.

In some embodiments, the method further includes recovering the discarded $1^{st}$, ..., (n–2)th, and nth logic pages of the current programming data by separating the $2^n$ logic states into pair-groups using read reference voltages $V_{R2}$, $V_{R4}$, ..., $V_{R(2^n-2)}$. The read reference voltage $V_{RL}$ is higher than a threshold voltage of state $P(L-1)$, but lower than a threshold voltage of state $P(L)$, wherein $L=2, 4, ..., 2^n-2$. Each pair-group comprises two distinct logic states based on a remaining (n–1)th logic page of the current programming data and the mapping scheme.

In some embodiments, the method further includes discarding an (n–1)th logic page of the current programming data after states P1, P2, ..., $P(2^n-1)$ of the selected row of memory cells have passed programming verification.

The present disclosure also provides a storage system. The storage system includes a memory device that includes memory cells arranged in rows and columns, each memory cell configured to store n-bit of data, wherein n is a whole number larger than 1; a control circuit configured to program a selected row of memory cells according to n logic pages of current programming data; and page buffers, each page buffer comprising n data latches and coupled to a column of memory cells through a bit line. The page buffers are configured to store the n logic pages of the current programming data for programming the selected row of memory cells; discard one or more of the n logic pages of the current programming data before the programming the selected row of memory cells according to the n logic pages of the current programming data is completed; and store one or more of n logic pages of new programming data before the programming the selected row of memory cells according to the n logic pages of the current programming data is completed. The storage system also includes a memory controller coupled to the memory device and configured to control the memory device.

The present disclosure further provides a memory device that includes memory cells arranged in rows and columns, each memory cell having $2^n$ logic states configured to store n-bit of data, wherein n is a whole number larger than 1. The memory device also includes a periphery circuit coupled to the memory cells and configured to program a selected row of memory cells according to n logic pages of current programming data. The periphery circuit includes page buffers, each page buffer including n data latches and coupled to a column of memory cells through a bit line. The periphery circuit is further configured to release an nth data latch, by discarding an nth logic page of the current programming data stored in the nth data latch, before the programming the selected row of memory cells according to the n logic pages of the current programming data is completed. The peripheral circuit is also configured to recover, according to a programming failure signal, the discarded nth logic page of the current programing data using a single level cell (SLC) read. The SLC read includes separating the $2^n$ logic states into a first group and a second group based on a read reference voltage. Each logic state in the first group is distinct based on the remaining logic pages of the current programming data; and each logic state in the second group is also distinct based on the remaining logic pages of the current programming data.

In some embodiments, each memory cell comprises an erase state (state ER), a $1^{st}$ logic state (state P1), ..., and an $(2^n-1)$th logic state (state $P(2^1-1)$), with threshold voltages in an ascending order.

In some embodiments, the selected row of memory cells are programmed to corresponding logic states in the ascending order of threshold voltages, from state P1 to state $P(2^n-1)$, according to the n logic pages of the current programming data.

In some embodiments, the programming failure signal indicates a sub-set of logic states that have passed programming verification.

In some embodiments, the nth data latch is released after states P1, P2, ..., and $P(2^{n-1})$ of the selected row of memory cells have passed programming verification.

In some embodiments, the read reference voltage is higher than a threshold voltage of state $P(2^{n-1}-1)$, but lower than a threshold voltage of state $P(2^{n-1})$.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
    memory cells arranged in rows and columns, each memory cell configured to store n-bit of data, where n is a whole number larger than two; and
    a periphery circuit coupled to the memory cells and configured to program selected memory cells according to n logic pages of current programming data, wherein:
    the periphery circuit comprises page buffers, each page buffer comprising latches; and
    the periphery circuit is configured to:
        store the n logic pages of the current programming data in the latches for programming the selected memory cells;
        release one or more of the latches, by discarding one or more of the n logic pages of the current programming data correspondingly, before the programming the selected memory cells according to the n logic pages of the current programming data is completed; and
        store one of n logic pages of next programming data in one or more of the latches before the programming the selected memory cells according to the n logic pages of the current programming data is completed.

2. The memory device of claim 1, wherein:
    the latches comprise n data latches and a cache latch; and
    the periphery circuit is further configured to:
        release one or more of the n data latches, by discarding one or more of the n logic pages of the current programming data correspondingly, before the programming the selected memory cells according to the n logic pages of the current programming data is completed; and
        store one of n logic pages of next programming data in the cache latch before the programming the selected memory cells according to the n logic pages of the current programming data is completed.

3. The memory device of claim 2, wherein the peripheral circuit is further configured to release a first data latch of the n data latches, by discarding a first logic page of the current programming data after states P1, P2, . . . , P($2^{n-1}$) of the selected memory cells have passed programming verification.

4. The memory device of claim 3, wherein the peripheral circuit is further configured to:
    transfer data from the cache latch to the first data latch after discarding the first logic page of the current programming data; and
    store a first logic page of the next programming data in the cache latch.

5. The memory device of claim 3, wherein the peripheral circuit is further configured to recover the first logic page of the current programming data by separating the $2^n$ logic states into two groups using a read reference voltage $V_{R2}^{n-1}$, wherein:
    the read reference voltage $V_{R2}^{n-1}$ is higher than a threshold voltage of state P($2^{n-1}-1$), but lower than a threshold voltage of state P($2^{n-1}$); and
    the logic states in each group are distinct based on the remaining logic pages of the current programming data and the mapping scheme.

6. The memory device of claim 4, wherein the peripheral circuit is further configured to release a second data latch of the n data latches, by discarding a second logic page of the current programming data after states P1, P2, . . . , and P($2^{n-1}+2^{n-2}$) of the selected memory cells have passed programming verification.

7. The memory device of claim 6, wherein the peripheral circuit is further configured to:
    transfer the first logic page of the next programming data from the cache latch to the second data latch after discarding the second logic page of the current programming data; and
    store a second logic page of the next programming data in the cache latch.

8. The memory device of claim 7, wherein the peripheral circuit is further configured to release a third data latch, by discarding a third logic page of the current programming data after states P1, P2, . . . , and P($2^n-2$) of the selected memory cells have passed programming verification.

9. The memory device of claim 8, wherein the peripheral circuit is further configured to:
    transfer the second logic page of the next programming data from the cache latch to the third data latch after discarding the third logic page of the current programming data; and
    store a third logic page of the next programming data in the cache latch.

10. The memory device of claim 9, wherein the peripheral circuit is further configured to release a fourth data latch, by discarding a fourth logic page of the current programming data after states P1, P2, . . . , and P($2^n-1$) of the selected memory cells have passed programming verification.

11. The memory device of claim 10, wherein the peripheral circuit is further configured to:
    transfer the third logic page of the next programming data from the cache latch to the fourth data latch or a latch SL of the page buffer after discarding the fourth logic page of the current programming data; and
    store a fourth logic page of the next programming data in the cache latch.

12. The memory device of claim 6, wherein the peripheral circuit is further configured to release a third data latch, by discarding a third logic page of the current programming data after states P1, P2, . . . , and P($2^n-1$) of the selected memory cells have passed programming verification.

13. The memory device of claim 12, wherein the peripheral circuit is further configured to:
   transfer the second logic page of the next programming data from the cache latch to the third data latch or a latch SL of the page buffer after discarding the third logic page of the current programming data; and
   store a third logic page of the next programming data in the cache latch.

14. The memory device of claim 1, wherein the peripheral circuit is further configured to recover the discarded one or more of the n logic pages of the current programing data when there is a programming failure, based on remaining logic pages of the current programming data, logic states of the selected memory cells that have passed programming verification and a mapping scheme between a set of n-bit binary codes and $2^n$ logic states of each memory cell.

15. A method of cache programming for a memory device comprising memory cells arranged in rows and columns, the method comprising:
   storing n logic pages of current programming data in page buffers, where n is a whole number greater than 1, each page buffer comprising latches;
   programming a selected memory cells according to the n logic pages of current programming data;
   discarding one or more of the n logic pages of the current programming data before the programming the selected memory cells according to the n logic pages of the current programming data is completed; and
   storing one of n logic pages of next programming data before the programming the selected memory cells according to the n logic pages of the current programming data is completed.

16. The method of claim 15, further comprising:
   after discarding the one or more of the n logic pages of current programming data, programming the selected memory cells based on remaining logic pages of current programming data.

17. The method of claim 15, further comprising:
   recovering the discarded one or more of the n logic pages of the current programming data when there is a programming failure.

18. The method of claim 15, further comprising:
   storing at least one logic page of the next programming data before the programming the selected memory cells according to the n logic pages of the current programming data is completed.

19. A memory system, comprising:
   a memory device comprising:
      memory cells arranged in rows and columns, each memory cell configured to store n-bit of data, where n is a whole number larger than 1; and
      a periphery circuit coupled to the memory cells and configured to program selected memory cells according to n logic pages of current programming data, wherein:
      the periphery circuit comprises page buffers, each page buffer comprising latches; and
      the periphery circuit is configured to:
         store the n logic pages of the current programming data in the latches for programming the selected memory cells;
         release one or more of the latches, by discarding one or more of the n logic pages of the current programming data correspondingly, before the programming the selected memory cells according to the n logic pages of the current programming data is completed; and
         store one of n logic pages of next programming data in one or more of the latches before the programming the selected memory cells according to the n logic pages of the current programming data is completed; and
   a memory controller coupled to the memory device and configured to control the memory device.

20. The memory system of claim 19, wherein:
   the latches comprise n data latches and a cache latch; and
   the periphery circuit is further configured to:
      release one or more of the n data latches, by discarding one or more of the n logic pages of the current programming data correspondingly, before the programming the selected memory cells according to the n logic pages of the current programming data is completed; and
      store one of n logic pages of next programming data in the cache latch before the programming the selected memory cells according to the n logic pages of the current programming data is completed.

* * * * *